(12) United States Patent
Kashiwabara

(10) Patent No.: US 8,415,658 B2
(45) Date of Patent: Apr. 9, 2013

(54) ORGANIC ELECTROLUMINESCENCE DEVICE, DISPLAY UNIT INCLUDING THE SAME, AND METHOD OF MANUFACTURING AN ORGANIC ELECTROLUMINESCENCE DEVICE

(75) Inventor: Mitsuhiro Kashiwabara, Kanagawa (JP)

(73) Assignee: Sony Corporation, Tokyo (JP)

( * ) Notice: Subject to any disclaimer, the term of this patent is extended or adjusted under 35 U.S.C. 154(b) by 142 days.

(21) Appl. No.: 12/815,017

(22) Filed: Jun. 14, 2010

(65) Prior Publication Data

US 2010/0320481 A1  Dec. 23, 2010

(30) Foreign Application Priority Data

Jun. 23, 2009 (JP) ................. P2009-148888

(51) Int. Cl.
*H01L 51/52* (2006.01)
(52) U.S. Cl. .......................... 257/40; 257/432
(58) Field of Classification Search .............. 257/40, 257/82, 98, 642, E51.001, E51.003, E51.018, 257/E51.022, E51.023, E25.008, E21.007, 257/79, 88, 89, 96, 100, E33.01, 3, E33.056; 438/29, 82, 99, 780, FOR. 135
See application file for complete search history.

(56) References Cited

U.S. PATENT DOCUMENTS

| | | | | |
|---|---|---|---|---|
| 4,919,521 A * | 4/1990 | Tada et al. | | 359/296 |
| 6,262,441 B1 * | 7/2001 | Bohler et al. | | 257/103 |
| 7,245,065 B2 * | 7/2007 | Ghosh et al. | | 313/110 |
| 2004/0145303 A1 * | 7/2004 | Yamada et al. | | 313/504 |
| 2005/0037232 A1 * | 2/2005 | Tyan et al. | | 428/690 |
| 2008/0067926 A1 * | 3/2008 | Mizuno et al. | | 313/504 |

FOREIGN PATENT DOCUMENTS

| | | |
|---|---|---|
| JP | 8-185984 | 7/1996 |
| JP | 2004-164890 | 6/2004 |

* cited by examiner

*Primary Examiner* — Olik Chaudhuri
*Assistant Examiner* — Quovaunda V Jefferson
(74) *Attorney, Agent, or Firm* — K&L Gates LLP

(57) ABSTRACT

An organic electroluminescence device includes a first electrode, an organic layer formed on the first electrode and including a light-emitting layer, an intermediate layer formed on the organic layer; and a second electrode formed on the intermediate layer and having a thickness of 6 nm or less.

18 Claims, 10 Drawing Sheets

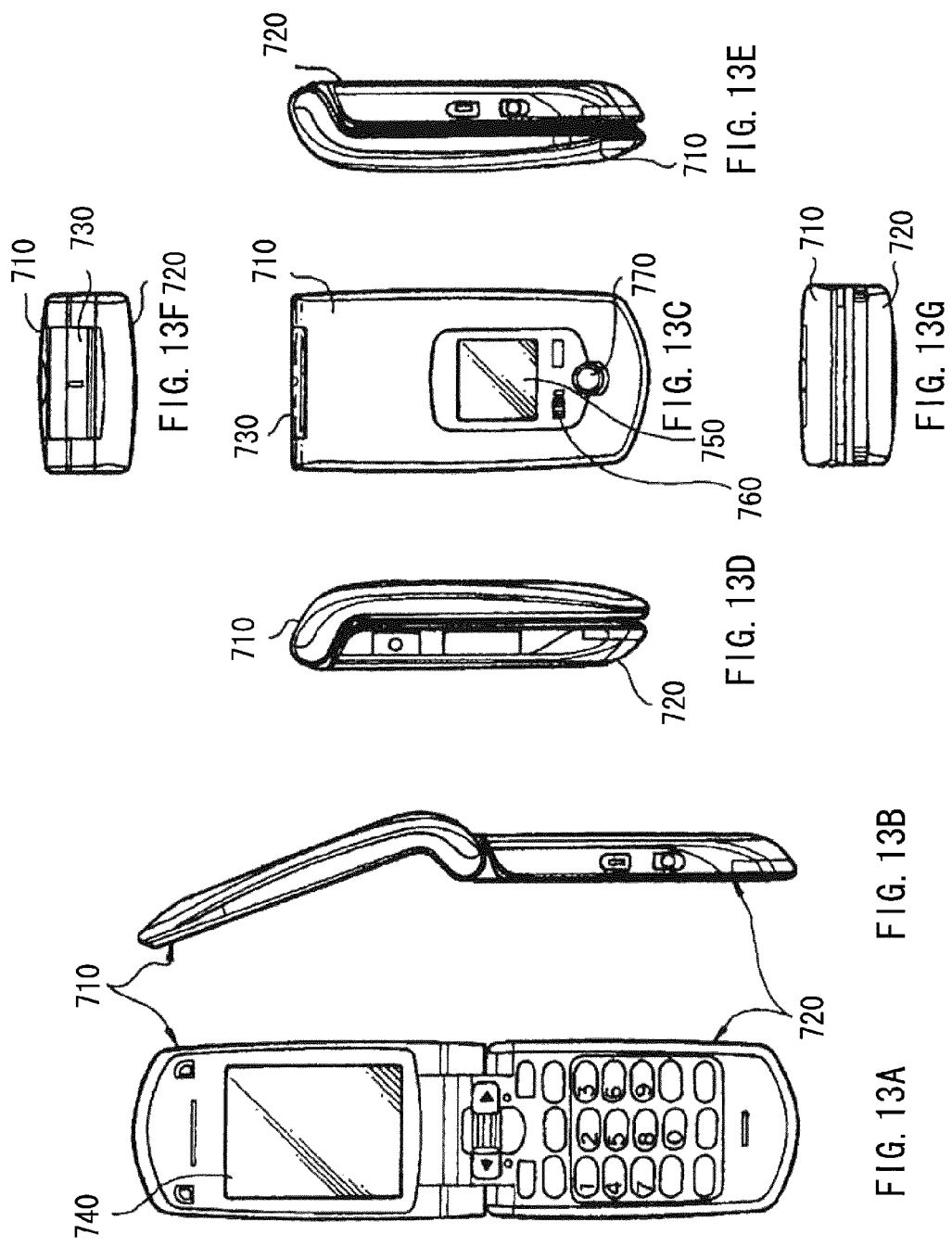

ORGANIC ELECTROLUMINESCENCE DEVICE, DISPLAY UNIT INCLUDING THE SAME, AND METHOD OF MANUFACTURING AN ORGANIC ELECTROLUMINESCENCE DEVICE

CROSS REFERENCES TO RELATED APPLICATIONS

The present application claims priority to Japanese Priority Patent Application JP 2009-148888 filed on Jun. 23, 2009, the entire contents of which is hereby incorporated by reference.

BACKGROUND

The present disclosure relates to an organic electroluminescence (EL) device suitable for a device including a resonator structure and a display unit including the same.

The organic EL device in which electroluminescence of an organic material is used has been already applied to an organic EL display unit as a light emitting device capable of realizing high luminance light emission by low voltage direct current drive. The organic EL device has, for example, a structure in which a lower electrode, an organic layer including a light emitting layer, and an upper electrode are sequentially layered over a substrate. Light generated in the light emitting layer is extracted from one of the lower electrode side and the upper electrode side or both sides. In the case where the light is extracted from the upper electrode, the upper electrode is made of, for example, a transparent conductive film. As a material of the transparent conductive film, for example, a metal oxide conductive material such as an oxide of indium and tin (ITO) and an oxide of indium and zinc (IZO) is used.

However, in the case where the transparent conductive material composed of the metal oxide is used, device characteristics are lowered due to damage at the time of sputtering deposition. Further, a sputtering film is strongly characterized by intruding into and adhering to a projection and a defect section of a deposition face. In addition, in order to express the electric conductivity of the metal oxide, the film thickness thereof should be about 15 nm or more. Thus, there is a high possibility that the metal oxide conductive material adheres to a foreign matter or a defect on the lower electrode or a defect section of the organic film, and short circuit between the upper electrode and the lower electrode is generated.

As a material of the upper electrode, a conductive film made of a metal film is also used. For example, in Japanese Unexamined Patent Application Publication No. 2004-164890, a description is given that an electron injection metal having a refractive index of 1 or less and an extinction coefficient of 0.5 or more is preferable as a material of the metal film in order to decrease absorption loss. For example, Japanese Unexamined Patent Application Publication No. 2004-164890 exemplifies a simple body or an alloy of aluminum, magnesium, calcium, sodium and the like.

The metal film has a thickness of about 10 nm, and functions as an electrode. The film thickness of the metal film necessary for expressing electric conductivity is small. Thus, there is a small possibility that short circuit is generated in a foreign matter or a defect on the lower electrode or a defect section of the organic film. Further, in the case where the metal film is deposited by vacuum evaporation method under high vacuum by using resistance heating, evaporation particle scattering caused by collision with gas molecules is hardly generated, and there is a small possibility that the conductive material intrudes into a foreign matter or a defect on the lower electrode or a defect section of the organic film.

However, there has been a disadvantage that the electric conductivity of the foregoing metal film is lowered by thinning the metal film. In the case of an alloy of magnesium and silver (Mg—Ag alloy), high electric conductivity is retained even if the film is thinned, but thinning limit has been above 6 nm. That is, in the past, there has been no known successful example that electric conductivity is retained to the degree that an organic EL device is able to be sufficiently driven with the use of a metal film having a thickness of 6 nm or less.

For example, in Japanese Unexamined Patent Application Publication No. 8-185984, a description is given that an upper electrode is made of an oxide conductive material, and a transparent Mg—Ag alloy film having a thickness of 2 nm is provided between an organic layer and the upper electrode in order to improve electron injection characteristics. The Mg—Ag alloy film does not have a function as an electrode, and has only a function as an electron injection layer. The oxide conductive material is responsible for electric conductivity.

Therefore, it is desirable to provide an organic electroluminescence device in which an upper electrode is made of a metal film, and the thickness of the metal film is able to be thinned down to 6 nm or less while electric conductivity of the metal film is retained, and a display unit including the same.

SUMMARY

In an embodiment, an organic electroluminescence device includes a first electrode, an organic layer formed on the first electrode and including a light-emitting layer, an intermediate layer formed on the organic layer, and a second electrode formed on the intermediate layer and having a thickness of 6 nm or less. In an embodiment, the organic layer includes an electron hole injection layer, an electron hole transport layer, the light-emitting layer, an electron transport layer, and an electron injection layer that are layered in that order from a first electrode side. In an embodiment, the second electrode is made of a metal conductive film including an alloy comprising one or more of aluminum, magnesium, calcium and sodium. In an embodiment, the alloy of the second electrode is a Mg—Ag alloy or an Al—Li alloy. In an embodiment, the intermediate layer includes calcium or aluminum. In an embodiment, sheet resistance of a film comprising the intermediate layer and the second electrode is 10,000Ω/□ or less. In one embodiment, at least a portion of a metal element contained in the intermediate layer is diffused into the second electrode In another embodiment, the intermediate layer is at least substantially diffused into the second electrode.

In another embodiment, a display device includes at least one organic electroluminescent device. In this embodiment, the organic electroluminescent device includes a first electrode, an organic layer formed on the first electrode and including a light-emitting layer, an intermediate layer formed on the organic layer, and a second electrode formed on the intermediate layer and having a thickness of 6 nm or less.

In another embodiment, an organic electroluminescence device includes an intermediate layer, and an electrode formed on the intermediate layer and having a thickness of 6 nm or less. In this embodiment, a sheet resistance of a film comprising the intermediate layer and the electrode is 10,000Ω/□ or less.

In another embodiment, a method of manufacturing an organic electroluminescence device includes: forming a first electrode; forming an organic layer on the first electrode; forming a laminated film including an intermediate layer and a second electrode by forming the intermediate layer on the organic layer, and forming the second electrode on the intermediate film, wherein a thickness of the second electrode is 6 nm or less. In one embodiment, the method further includes at least substantially diffusing a material of the intermediate layer into the second electrode, such that the laminated film is an integrated electrode layer composed of the intermediate layer and the second electrode.

According to another embodiment, an organic electroluminescence device includes an intermediate layer composed of a metal element such as an alkali metal provided between an upper or second electrode and an organic layer in contact with the upper electrode. In addition, in one embodiment, the thickness of the intermediate layer is from 0.1 nm to 5 nm both inclusive. According to another embodiment, an organic electroluminescence device includes an upper or second electrode containing an alloy of magnesium or the like as a main component, and containing a metal element such as an alkali metal. Thus, lowering of electric conductivity caused by degeneration of the upper electrode is inhibited, and the thickness of the upper electrode is able to be decreased down to 6 nm or less. In particular, the embodiments are suitable for an organic electroluminescence device in which a resonator structure is included, and light generated in the light emitting layer is resonated between the lower electrode and the upper electrode.

According to another embodiment, a display unit includes at least one of the above-described embodiments. Thus, electric conductivity of the upper electrode is maintained, and the organic electroluminescence device is able to be favorably driven.

Additional features and advantages are described herein, and will be apparent from the following Detailed Description and the figures.

BRIEF DESCRIPTION OF THE FIGURES

FIG. 13A is an elevation view of a fifth application example unclosed,

FIG. 13B is a side view thereof, FIG. 13C is an elevation view of the fifth application example closed, FIG. 13D is a left side view thereof, FIG. 13E is a right side view thereof, FIG. 13F is a top view thereof, and FIG. 13G is a bottom view thereof.

DETAILED DESCRIPTION

Embodiments will be hereinafter described in detail with reference to the drawings. The description will be given in the following order:

1. First embodiment (example that a first resonator structure is structured by a lower electrode and an upper electrode)

2. First modified example (example that an intermediate layer 18 and an upper electrode 17 are integrated)

3. Second embodiment (example that a second resonator structure is structured by providing a resonance adjustment layer on an upper electrode)

4. Examples

First Embodiment

Figure 1:
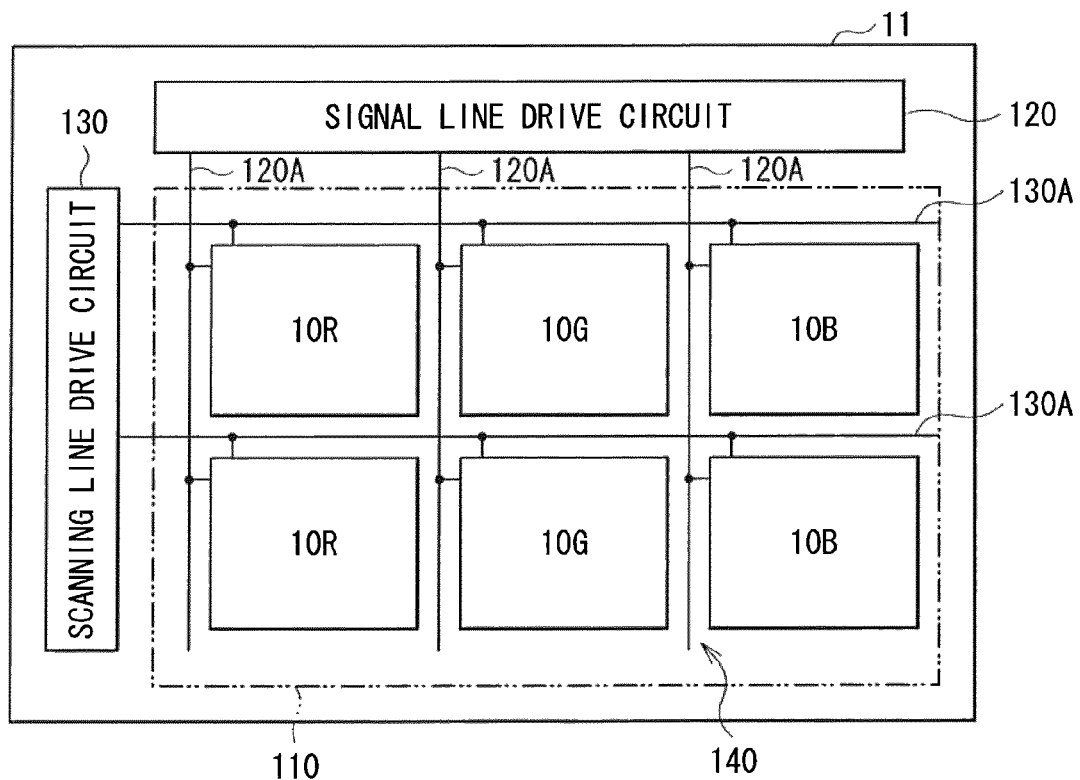
FIG. 1 is a diagram illustrating a structure of a display unit according to a first embodiment.

FIG. 1 illustrates a structure of a display unit according to a first embodiment. The display unit is used as an organic EL television device or the like. In the display unit, for example, as a display region 110, an after-mentioned plurality of organic EL devices 10R, 10G, and 10B are arranged in a matrix state over a substrate 11. A signal line drive circuit 120 and a scanning line drive circuit 130 that are drivers for displaying a video are provided on the periphery of the display region 110.

Figure 2:
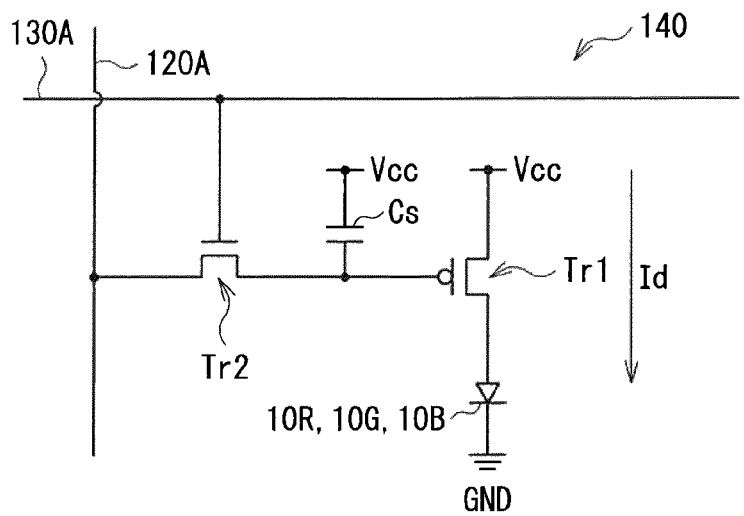
FIG. 2 is a diagram illustrating an example of the pixel drive circuit illustrated in FIG. 1.

In the display region 110, a pixel drive circuit 140 is provided. FIG. 2 illustrates an example of the pixel drive circuit 140. The pixel drive circuit 140 is an active drive circuit that is formed in a layer located lower than an after-mentioned lower electrode 14. That is, the pixel drive circuit 140 has a drive transistor Tr1, a writing transistor Tr2, a capacitor (retentive capacity) Cs between the drive transistor Tr1 and the writing transistor Tr2, and the organic EL device 10R (or 10G, 10B) serially connected to the drive transistor Tr1 between a first power line (Vcc) and a second power line (GND). The drive transistor Tr1 and the writing transistor Tr2 are composed of a general thin film transistor (TFT (Thin Film Transistor)). The structure thereof is not particularly limited, and may be, for example, inversely staggered structure (so-called bottom gate type) or staggered structure (top gate type).

In the pixel drive circuit 140, a plurality of signal lines 120A are arranged in the column direction, and a plurality of scanning lines 130A are arranged in the row direction. Each cross section between each signal line 120A and each scanning line 130A corresponds to one of the organic light emitting devices 10R, 10G, and 10B (sub pixel). Each signal line 120A is connected to the signal line drive circuit 120. An image signal is supplied to a source electrode of the writing transistor Tr2 from the signal line drive circuit 120 through the signal line 120A. Each scanning line 130A is connected to the scanning line drive circuit 130. A scanning signal is sequentially supplied to a gate electrode of the writing transistor Tr2 from the scanning line drive circuit 130 through the scanning line 130A.

Further, in the display region 110, the organic EL device 10R generating red light, the organic EL device 10G generating green light, and the organic EL device 10B generating blue light are sequentially arranged in a matrix state as a whole. A combination of the organic EL devices 10R, 10G, and 10B adjacent to each other composes one pixel.

Figure 3:
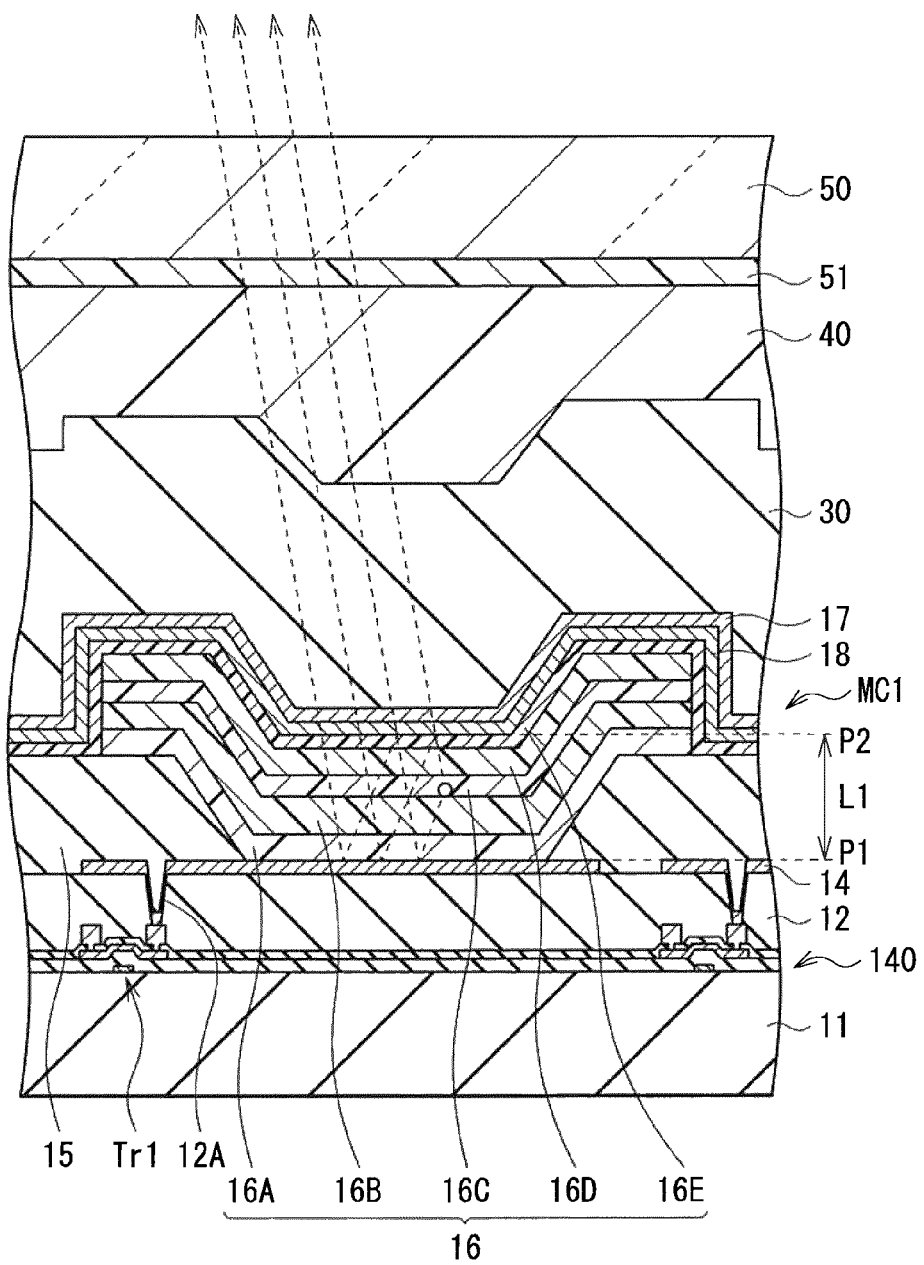
FIG. 3 is a cross sectional view illustrating a structure of the organic EL device illustrated in FIG. 1.

FIG. 3 illustrates a cross sectional structure of the organic EL devices 10R, 10G, and 10B illustrated in FIG. 1. The organic EL devices 10R, 10G, and 10B respectively have a structure in which the drive transistor Tr1 of the foregoing pixel circuit 140, a planarizing insulating film 12, the lower or first electrode 14 as an anode, an inter-electrode insulating film 15, an organic layer 16 including a light emitting layer 16C described later, and an upper or second electrode 17 as a cathode are layered in this order from the substrate 11 side.

The organic EL devices 10R, 10G, and 10B as above are coated with a protective layer 30. Further, a sealing substrate 50 made of glass or the like is bonded to the whole area of the protective layer 30 with an adhesive layer 40 in between, and thereby the organic EL devices 10R, 10G, and 10B are sealed.

The substrate 11 is made of glass, a silicon (Si) wafer, a resin or the like. The drive transistor Tr1 is electrically connected to the lower electrode 14 through a connection hole 12A provided in the planarizing insulating film 12.

The planarizing insulating film 12 is intended to planarize a front face of the substrate 11 over which the pixel driving circuit 140 is formed. Since the fine connection hole 12A is provided, the planarizing insulating film 12 is preferably made of a material having favorable pattern precision. Examples of component materials of the planarizing insulating film 12 include an organic material such as polyimide and an inorganic material such as silicon oxide ($SiO_2$).

The lower electrode 14 also has a function as a reflecting layer, and desirably has high reflectance as much as possible in order to improve light emission efficiency. In particular, in the case where the lower electrode 14 is used as an anode, the lower electrode 14 is desirably made of a material having high electron hole injection characteristics. Such a lower electrode 14 has, for example, a lamination direction thickness (hereinafter simply referred to as thickness) from 100 nm to 1000 nm both inclusive. Examples of material of the lower electrode 14 include a simple substance or an alloy of metal elements such as chromium (Cr), gold (Au), platinum (Pt), nickel (Ni), copper (Cu), tungsten (W), and silver (Ag). A transparent conductive film composed of an oxide of indium and tin (ITO) or the like may be provided on the surface of the lower electrode 14. If an appropriate electron hole injection layer is provided, it is able to use a material that has high reflectance but has a disadvantage of an electron hole injection barrier due to existence of an oxide film on the surface and a small work function such as an aluminum (Al) alloy as the lower electrode 14.

The inter-electrode insulating film 15 is intended to secure insulation between the lower electrode 14 and the upper electrode 17, and to obtain a desired shape of the light emitting region. For example, the inter-electrode insulating film 15 is made of a photosensitive resin. The inter-electrode insulating film 15 is provided with an aperture correspondingly to the light emitting region. Though the organic layer 16 and the upper electrode 17 are provided not only in the aperture but also over the inter-electrode insulating film 15, light is emitted only in the aperture of the inter-electrode insulating film 15.

The organic layer 16 has, for example, a structure in which an electron hole injection layer 16A, an electron hole transport layer 16B, the light emitting layer 16C, an electron transport layer 16D, and an electron injection layer 16E are layered from the lower electrode 14 side. Of the foregoing layers, the layers other than the light emitting layer 16C may be provided according to needs. The organic layer 16 may have a structure varying according to the light emitting color of the organic EL devices 10R, 10G, and 10B. The electron hole injection layer 16A is intended to improve the electron hole injection efficiency and functions as a buffer layer to prevent leakage. The electron hole transport layer 16B is intended to improve efficiency to transport electron holes into the light emitting layer 16C. The light emitting layer 16C is intended to generate light due to electron-hole recombination by impressing an electric field. The electron transport layer 16D is intended to improve efficiency to transport electrons into the light emitting layer 16C. The electron injection layer 16E is intended to improve efficiency to inject electrons.

The electron hole injection layer 16A of the organic EL device 10R has, for example, a thickness from 5 nm to 300 nm both inclusive, and is composed of the hexaazatriphenylene derivative shown in Chemical formula 1 or Chemical formula 2. The electron hole transport layer 16B of the organic EL device 10R has, for example, a thickness from 5 nm to 300 nm both inclusive, and is composed of bis[(N-naphthyl)-N-phenyl]benzidine (α-NPD). The light emitting layer 16C of the organic EL device 10R has, for example, a thickness from 10 nm to 100 nm both inclusive, and is composed of a material in which 40 volume % of 2,6-bis[4-[N-(4-metoxyphenyl)-N-phenyl]aminostyril]naphthalene-1,5-dicarbonitrile (BSN-BCN) is mixed with 8-quinolinol aluminum complex ($Alq_3$). The electron transport layer 16D of the organic EL device 10R has, for example, a thickness from 5 nm to 300 nm both inclusive, and is made of Alq3. The electron injection layer 16E of the organic EL device 10R has, for example, a thickness about 0.3 nm, and is made of LiF, $Li_2O$ or the like.

Chemical formula 1

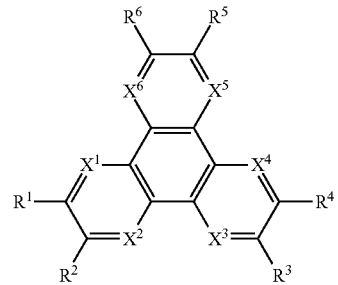

In Chemical formula 1, R1 to R6 respectively and independently represent hydrogen; halogen; a hydroxyl group; an amino group; an aryl amino group; a substituted/unsubstituted carbonyl group having the carbon number of 20 or less; a substituted/unsubstituted carbonylester group having the carbon number of 20 or less; a substituted/unsubstituted alkyl group having the carbon number of 20 or less; a substituted/unsubstituted alkenyl group having the carbon number of 20 or less; a substituted/unsubstituted alkoxyl group having the carbon number of 20 or less; a substituted/unsubstituted aryl group having the carbon number of 30 or less; a substituted/unsubstituted heterocyclic group having the carbon number of 30 or less; or a substituted group selected from a group consisting of a nitrile group, a cyano group, a nitro group, and a silyl group. Each Rm (m=1 to 6) adjacent to each other may be bonded with each other through an annular structure. Further, X1 to X6 respectively and independently represent a carbon atom or a nitrogen atom.

Specifically, the electron hole injection layer 16A of the organic EL device 10R is preferably made of the material shown in Chemical formula 2.

Chemical formula 2

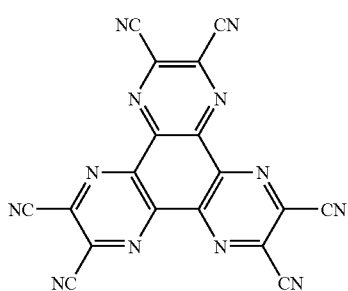

The electron hole injection layer 16A of the organic EL device 10G has, for example, a thickness from 5 nm to 300 nm both inclusive, and is composed of the hexaazatriphenylene derivative shown in Chemical formula 1 or Chemical formula 2. The electron hole transport layer 16B of the organic EL device 10G has, for example, a thickness from 5 nm to 300 nm both inclusive, and is composed of α-NPD. The light emitting layer 16C of the organic EL device 10G has, for example, a thickness from 10 nm to 100 nm both inclusive, and is composed of a material in which 1 volume % of coumarin 6 is mixed with Alq3. The electron transport layer 16D of the organic EL device 10G has, for example, a thickness from 5 nm to 300 nm both inclusive, and is made of Alq3. The electron injection layer 16E of the organic EL device 10G has, for example, a thickness about 0.3 nm, and is made of LiF, $Li_2O$ or the like.

The electron hole injection layer 16A of the organic EL device 10B has, for example, a thickness from 5 nm to 300 nm both inclusive, and is composed of the hexaazatriphenylene derivative shown in Chemical formula 1 or Chemical formula 2. The electron hole transport layer 16B of the organic EL device 10B has, for example, a thickness from 5 nm to 300 nm both inclusive, and is composed of α-NPD. The light emitting layer 16C of the organic EL device 10B has, for example, a thickness from 10 nm to 100 nm both inclusive, and is composed of spiro 6Φ. The electron transport layer 16D of the organic EL device 10B has, for example, a thickness from 5 nm to 300 nm both inclusive, and is made of Alq3. The electron injection layer 16E of the organic EL device 10B has, for example, a thickness of about 0.3 nm, and is composed of LiF, $Li_2O$ or the like.

The upper electrode 17 is made of a metal conductive film. Specific examples thereof include an alloy of aluminum (Al), magnesium (Mg), calcium (Ca), or sodium (Na). Specially, an alloy of magnesium and silver (Mg—Ag alloy) is preferable, since the Mg—Ag alloy has electric conductivity and small absorption in a thin film. The ratio of magnesium and silver in the Mg—Ag alloy is not particularly limited, but the film thickness ratio of Mg:Ag is desirably in the range from 20:1 to 1:1. Further, the material of the upper electrode 17 may be an alloy of aluminum (Al) and lithium (Li) (Al—Li alloy).

The thickness of the second or upper electrode 17 is 6 nm or less, and preferably from 2 nm to 6 nm both inclusive. If the thickness thereof is 6 nm or less, it is possible to inhibit the material of the upper electrode 17 from adhering to the surrounding of a foreign matter on the lower electrode 14, and inhibit generation of non-light emitting defect (so-called lost point) due to electric short circuit between the lower electrode 14 and the upper electrode 17. Further, if the thickness thereof is 2 nm or more, it is possible to secure the electric conductivity of the upper electrode 17 to the degree at which driving the organic EL devices 10R, 10G, and 10B functions well.

Further, the thickness of the upper electrode 17 is more preferably from 2.5 nm to 6 nm both inclusive, since thereby driving the organic EL devices 10R, 10G, and 10B is sufficiently enabled.

The intermediate layer 18 is provided being contacted with the upper electrode 17 between the upper electrode 17 and the organic layer 16. The intermediate layer 18 has, for example, a thickness from 0.1 nm to 5 nm both inclusive, and contains one selected from the metal element group consisting of an alkali metal, an alkali earth metal, a lanthanoid metal, aluminum, indium, tin, nickel, copper, and zinc. Thereby, in the display unit, the thickness of the upper electrode 17 may be decreased down to 6 nm or less while electric conductivity of the upper electrode 17 is retained.

"Thickness of the upper electrode 17" and "thickness of the intermediate layer 18" in this specification are obtained by optical method such as spectroscopic ellipsometry. Further, "thickness of the upper electrode 17" and "thickness of the intermediate layer 18" are measured in a state of a product after being sealed with the sealing substrate 50 and being assembled.

The intermediate layer 18 has a function as a degeneration preventive layer to inhibit the upper electrode 17 from being directly contacted with the organic layer 16 and losing electric conductivity. Thus, the intermediate layer 18 desirably has a thickness with which degeneration preventive effect of the upper electrode 17 is obtained. Specifically, as described above, the intermediate layer 18 has a thickness of 0.1 nm or more. Further, in the case where the thickness of the intermediate layer 18 is 5 nm or less, lowering of efficiency due to light absorption is able to be small.

In the case where the upper electrode 17 is used as a cathode, the intermediate layer 18 is preferably made of an electron injection material. As described above, examples of such a material include the alkali metal, the alkali earth metal, and the lanthanoid metal. By providing the appropriate electron injection layer 16E, a metal having a larger work function than that of magnesium is able to be used. Examples of such a metal include a metal such as aluminum, indium, and tin; and a transition metal such as nickel, copper, and zinc.

Specifically, the intermediate layer 18 preferably contains calcium. Calcium has favorable electron injection characteristics to the organic layer 16, has high electric conductivity as a film, and has small absorption. Further, calcium as a single material is easily deposited onto the organic layer 16 comparatively, and calcium is not subject to drastic oxidation and hydroxylation reaction in the air differently from other material such as the alkali earth metal and the alkali metal. Thus, handling calcium in manufacturing is comparatively easy.

Otherwise, the intermediate layer 18 preferably contains aluminum. If aluminum is layered after the appropriate electron injection layer 16E such as lithium fluoride is formed thinly, aluminum expresses favorable electron injection characteristics. In addition, aluminum has effect to prevent degeneration of the upper electrode 17 further provided thereon.

The sheet resistance of the film composed of the intermediate layer 18 and the upper electrode 17 is preferably, for example, 10000Ω/□ or less. Thereby, in a panel structure in which a contact section is arranged in the vicinity of the pixel on the substrate, influence of voltage drop is able to be lowered, and drive voltage rise or luminance gradient in the pixel is able to be inhibited. For example, in a 100 inch full high definition display unit, one pixel pitch is 1.15 mm. In such a large pixel, if the white display light emitting efficiency is 20 cd/A and the display luminance is 200 $cd/m^2$, voltage drop from an end to the other end of the pixel is 0.13V, and there is a small possibility to impair the display quality.

The intermediate layer 18 and the upper electrode 17 are formed as a laminated film in a manufacturing step as described later. However, after the upper electrode 17 is formed, part of the metal element contained in the intermediate layer 18 may be distributed in the second electrode 17.

The upper electrode 17 also has a function as a translucent reflecting layer. That is, the organic EL devices 10R, 10G, and 10B have a resonator structure MC1 (first resonator structure MC1). Light generated in the light emitting layer 16C is resonated between the lower electrode 14 and the upper electrode 17 by the resonator structure MC1. In the resonator structure MC1, the interface between the lower electrode 14 and the organic layer 16 is a reflecting face P1, the interface between the intermediate layer 18 and the electron injection layer 16E is a translucent reflecting face P2, and the organic layer 16 is a resonance section. The light generated in the light emitting layer 16C is resonated and is extracted from the translucent reflecting face P2 side. In the case where the resonator structure MC1 is included, the light generated in the light emitting layer 16C generates multiple interference, the half bandwidth of spectrum of the light extracted from the translucent reflecting face P2 side is decreased, and the peak intensity is able to be increased. That is, the light radiation intensity in the front face direction is able to be increased, and the color purity of light emission is able to be improved. Outside light entering from the sealing substrate 50 side is also able to be decayed by multiple interference. By combining with an after-mentioned color filter 51, the reflectance of outside light in the organic EL devices 10R, 10G, and 10B is able to be significantly decreased.

To this end, an optical distance L1 between the reflecting face P1 and the translucent reflecting face P2 preferably satisfies Mathematical formula 1.

$$(2L1)/\lambda + \Phi/(2\pi) = m \qquad \text{Mathematical formula 1}$$

In the formula, "L1" represents the optical distance between the reflecting face P1 and the translucent reflecting face P2. "m" represents an order (0 or a natural number). "$\Phi$" represents a sum of phase shift $\Phi1$ of reflected light generated in the reflecting face P1 and phase shift $\Phi2$ of reflected light generated in the translucent reflecting face P2 ($\Phi=\Phi1+\Phi2$) (rad). "$\lambda$" represents a peak wavelength of spectrum of light that is desirably extracted from the translucent reflecting face P2 side. For L1 and $\lambda$ in the Mathematical formula 1, the unit should be unified, and for example, (nm) is used as the unit.

Between the reflecting face P1 and the translucent reflecting face P2, a position where the extraction light emitting strength becomes the maximum (resonance face) exists. The number of resonance faces is m+1. Under the conditions of m=1 or more, in the case where the light emitting face exists on a resonance face closest to the reflecting face P1, the half bandwidth of light emitting spectrum becomes widest.

In the organic EL devices 10R, 10G, and 10B having such a resonator structure MC1, there is a tendency that as the order m become larger, view angle dependence of luminance and chromaticity becomes larger, that is, difference of luminance and chromaticity between a case viewing in the front face direction and in a case viewing in the oblique direction becomes larger. In the case where assumption is made that the organic EL display unit is used for a general television device or the like, luminance lowering and chromaticity change according to view angle are desirably small. Specifically, at the time of white light emission, the spectral radiance ratio measured from 45 deg oblique direction with respect to the spectral radiance ratio measured from the front face is preferably 0.7 or more.

In view of only view angle characteristics, conditions m=0 are ideal. However, under such conditions, the thickness of the organic layer 16 is small, and thus there is a possibility that influence on light emitting characteristics and short circuit between the lower electrode 14 and the upper electrode 17 are generated. Thus, for example, by using the conditions m=1, view angle dependence of luminance and chromaticity is avoided from being increased, and lowering of light emitting characteristics and short circuit generation are inhibited. For example, in the case where the lower electrode 14 is composed of an aluminum alloy and the upper electrode 17 is composed of an Mg—Ag alloy respectively, the thickness of the organic layer 16 of the blue organic EL device 10B is about 80 nm if m is 0, and is about 190 nm if m is 1, and accordingly generation of short circuit is inhibited.

Further, in this embodiment, as described above, the thickness of the upper electrode 17 is decreased down to from 2 nm to 6 nm both inclusive. Thus, luminance lowering and chromaticity change according to the view angle are able to be more decreased for the following reason. That is, in the case where the thickness of the upper electrode 17 is decreased, the transmittance ratio of the upper electrode 17 is increased and the reflectance is lowered. In the result, out of light emission from the light emitting layer 16C, the ratio of light reflected by the upper electrode 17 toward the lower electrode 14 side is decreased. Thereby, the resonator structure MC1 is weakened, and angle dependence of light extracted from the translucent reflecting face P2 is decreased. Accordingly, for example, under the conditions that the order m is 1 or more, view angle dependence of luminance and chromaticity is able to be decreased, and an organic EL display unit having superior display performance is able to be obtained.

Figure 4A:
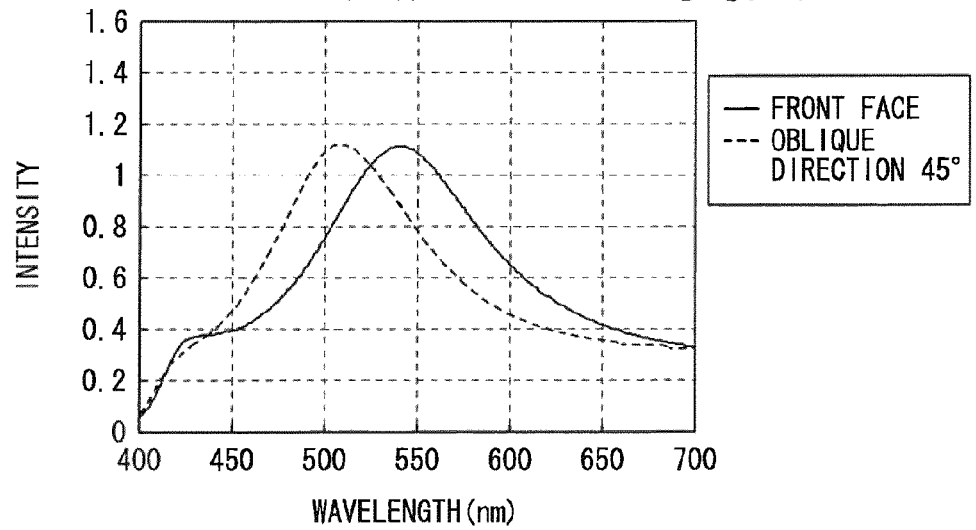
FIGS. 4A and 4B are diagrams for comparing view angle characteristics of the organic EL device having the resonator structure illustrated in FIG. 3 to an existing example.
Figure 4B:
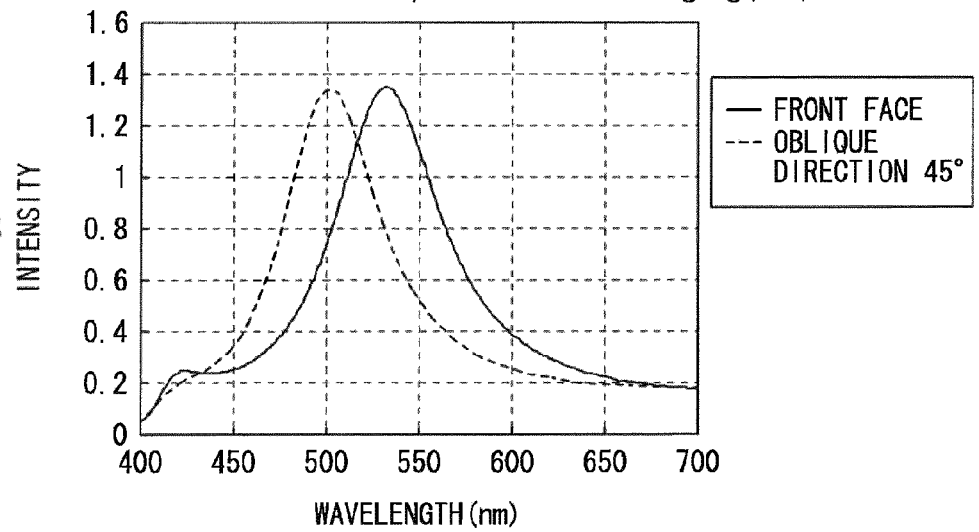

FIG. 4A illustrates spectrums in the case where the intermediate layer 18 composed of Ca having a thickness of 2 nm and the upper electrode 17 composed of an Mg—Ag alloy having a thickness of 4 nm are provided in the organic EL device having the resonator structure MC1. The spectrums show results of viewing from the front face and from 45 deg oblique direction by optical simulation. FIG. 4B illustrates spectrums similarly obtained by optical simulation in the case where the intermediate layer 18 is not provided and only the upper electrode 17 composed of an Mg—Ag alloy having a thickness of 8 nm is provided. As evidenced by FIG. 4A and FIG. 4B, in the former case in which the intermediate layer 18 is provided, the spectrum half bandwidth is wider, the peak intensity is lower, and resonator effect is more modified than in the latter case, but change of light emitting characteristics according to the view angle is more decreased than in the latter case.

The protective layer 30 illustrated in FIG. 3 is composed of silicon nitride ($SiN_x$), silicon oxide, a metal oxide or the like. The adhesive layer 40 illustrated in FIG. 3 is composed of, for example, a heat-hardening resin or a ultraviolet hardening resin.

The sealing substrate 50 illustrated in FIG. 3 is located on the upper electrode 17 side of the organic EL devices 10R, 10G, and 10B. The sealing substrate 50 seals the organic light EL devices 10R, 10G, and 10B together with the adhesive layer 40, and is made of a material such as glass transparent to light generated in the organic light EL devices 10R, 10G, and 10B. The sealing substrate 50 is, for example, provided with the color filter 51, which extracts the light generated in the organic light EL devices 10R, 10G, and 10B, and absorbs outside light reflected by the organic EL devices 10R, 10G, and 10B and the wiring in between to improve contrast.

The color filter 51 may be provided on any face of the sealing substrate 50, but is preferably provided on the side of the organic EL devices 10R, 10G, and 10B. Thereby, the color filter 51 is not exposed on the surface, and is able to be protected by the adhesive layer 40. Further, in this case, since the distance between the light emitting layer 16C and the color filter 51 is narrowed, it is possible to avoid an event that light emitted from the light emitting layer 16C enters an adjacent color filter 51 of other color to generate mixed color. The color filter 51 has a red filter, a green filter, and a blue filter (not illustrated), which are sequentially arranged correspondingly to the organic EL devices 10R, 10G, and 10B.

The red filter, the green filter, and the blue filter are respectively formed in the shape of, for example, a rectangle with no space in between. The red filter, the green filter, and the blue filter are respectively made of a resin mixed with a pigment. Adjustment is made by selecting a pigment so that light transmittance in the intended red, green, or blue wavelength region is high, and light transmittance in the other wavelength regions is low.

Further, the wavelength range with high transmittance in the color filter 51 corresponds with peak wavelength $\lambda$ of spectrum of light that is desirably extracted from the resonator structure MC1. Thereby, out of outside light entering from the sealing substrate 50, only light having a wavelength equal to the peak wavelength $\lambda$ of spectrum of light that is desirably extracted passes through the color filter 51, and outside light in other wavelengths is prevented from intruding into the organic light EL devices 10R, 10G, and 10B.

The display unit is able to be manufactured, for example, as follows.

First, the pixel drive circuit 140 including the drive transistor Tr1 is formed on the substrate 11 made of the foregoing material. After that, the planarizing insulating film 12 is formed by coating the whole area of the substrate 11 with a sensitive resin, and the planarizing insulating film 12 is patterned into a given shape by exposure and development, the connection hole 12A is formed, and the resultant is fired.

Next, the lower electrode 14 made of the foregoing material is formed by, for example, sputtering method, and the lower electrode 14 is selectively removed by wet etching. Thereby, the respective organic light emitting devices 10R, 10G, and 10B are separated individually.

Subsequently, the whole area of the substrate 11 is coated with a photosensitive resin. An aperture is provided correspondingly to the light emitting region by, for example, photolithography method, and the resultant is fired. Accordingly, the inter-electrode insulating film 15 is formed.

After that, the electron hole injection layer 16A, the electron hole transport layer 16B, the light emitting layer 16C, and the electron transport layer 16D of the organic layer 16 that have the foregoing thickness and are made of the foregoing material are formed by, for example, evaporation method.

After the organic layer 16 is formed, the laminated film composed of the intermediate layer 18 and the upper electrode 17 that have the foregoing thickness and are made of the foregoing material is deposited by, for example, evaporation method. After the upper electrode 17 is formed, part of the metal element contained in the intermediate layer 18 may be diffused and distributed in the second electrode 17. Accordingly, the organic EL devices 10R, 10G, and 10B as illustrated in FIG. 3 are formed.

Subsequently, the protective layer 30 that is made of the foregoing material is formed on the organic EL devices 10R, 10G, and 10B by, for example, CVD method or sputtering method.

Further, for example, the sealing substrate 50 made of the foregoing material is coated with a material of the red filter by spin coating or the like, the resultant is provided with patterning by photolithography technology, and fired. Thereby, the red filter is formed. Subsequently, the blue filter and the green filter are sequentially formed in the same manner as that of the red filter.

After that, the adhesive layer 40 is formed on the protective layer 30. The sealing substrate 50 and the protective layer 30 are bonded with the adhesive layer 40 in between. At this time, the face of the sealing substrate 50 on which the color filter 51 is formed is preferably arranged on the side of the organic EL devices 10R, 10G, and 10B. Accordingly, the display unit illustrated in FIG. 1 to FIG. 3 is completed.

In the display unit, the scanning signal is supplied from the scanning line drive circuit 130 to each pixel through the gate electrode of the writing transistor Tr2, and the image signal from the signal line drive circuit 120 is retained in the retentive capacity Cs through the writing transistor Tr2. That is, the drive transistor Tr1 is on-off controlled according to the signal retained in the retentive capacity Cs, and thereby a drive current Id is injected into the respective organic light emitting devices 10R, 10G, and 10B. In the result, electron-hole recombination is generated to initiate light emission. The light is multiply reflected between the lower electrode 14 (reflecting face P1) and the upper electrode 17 (translucent reflecting face P2). After that, the light passes through the upper electrode 17, the color filter 51, and the sealing substrate 50, and is extracted.

In this case, the intermediate layer 18 is provided being contacted with the upper electrode 17 between the upper electrode 17 and the organic layer 16. The intermediate layer 18 contains one selected from the metal element group consisting of the foregoing alkali metal and the like, and has a thickness from 0.1 nm to 5 nm both inclusive. Thus, degeneration of the upper electrode 17 and lowering of electric conductivity caused by direct contact between the upper electrode 17 and the organic layer 16 are inhibited, the organic EL devices 10R, 10G, and 10B are favorably driven, and favorable display performance is able to be obtained for a long term. Further, since the thickness of the upper electrode 17 is small, generation of non-light emitting defect due to short circuit between the lower electrode 14 and the upper electrode 17 is inhibited.

Further, in the case where the organic EL devices 10R, 10G, and 10B have the resonator structure MC1, by decreasing the thickness of the upper electrode 17, the resonator structure MC1 is weakened, and view angle dependence of light extracted from the translucent reflecting face P2 is decreased. Accordingly, for example, under the conditions that the order m is 1 or more and view angle dependence of luminance and chromaticity is easily significant, luminance and chromaticity change according to the view angle is moderated.

As described above, in the organic EL devices 10R, 10G, and 10B of this embodiment, the intermediate layer 18 is provided being contacted with the upper electrode 17 between the upper electrode 17 and the organic layer 16. The intermediate layer 18 contains one selected from the metal element group consisting of the alkali metal and the like, and has a thickness from 0.1 nm to 5 nm both inclusive. Thus, lowering of electric conductivity caused by degeneration of the upper electrode 17 is inhibited, and the thickness of the upper electrode 17 may be decreased down to from 2 nm to 6 nm both inclusive. Thus, in the case where a display unit is structured by using the organic EL devices 10R, 10G, and 10B, electric conductivity of the upper electrode 17 is retained, the organic EL devices 10R, 10G, and 10B are favorably driven, and non-light emitting defect is able to be decreased. In particular, the embodiments are suitable for the organic EL devices 10R, 10G, and 10B in which the resonator structure MC1 is included, and light generated in the light emitting layer 16C is resonated between the lower electrode 14 and the upper electrode 17.

First Modified Example

Figure 5:
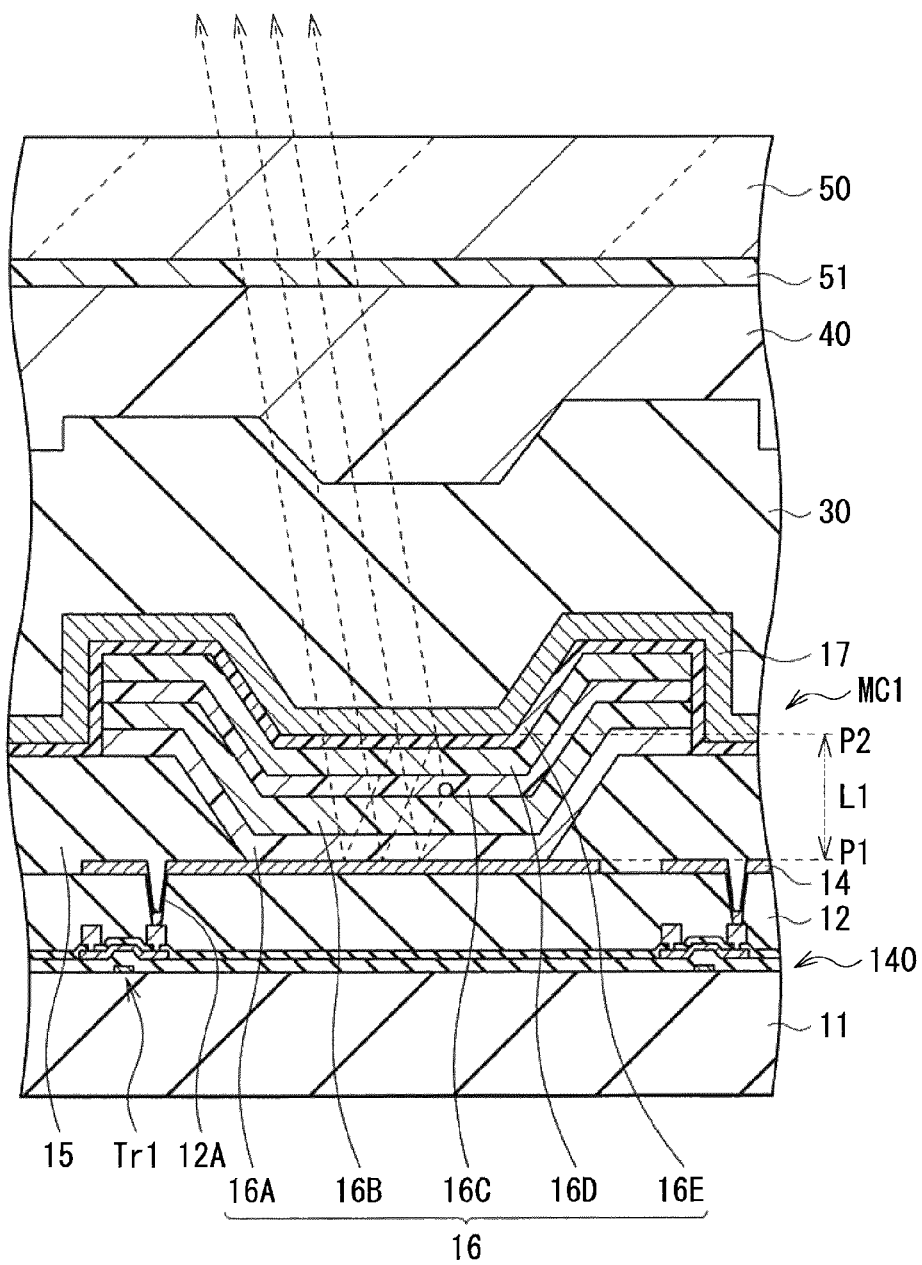
FIG. 5 is a cross sectional view illustrating a structure of an organic EL device according to a first modified example.

FIG. 5 illustrates a cross sectional structure of the organic EL devices 10R, 10G, and 10B of a display unit according to a first modified example. The organic EL devices 10R, 10G, and 10B have a structure similar to that of the foregoing first embodiment, except that a material of the intermediate layer 18 is totally diffused in the upper electrode 17, and the intermediate layer 18 is integrated with the upper electrode 17. Thus, a description will be given by affixing the same referential symbols for the corresponding elements.

The upper electrode 17 has a thickness from 2 nm to 6 nm both inclusive. The upper electrode 17 contains an alloy containing magnesium (Mg), aluminum (Al), calcium (Ca), or sodium (Na) as a main component, and contains one selected from the metal element group consisting of an alkali metal, an alkali earth metal, a lanthanoid metal, aluminum, indium, tin, nickel, copper, and zinc. Thereby, in the display unit, the thickness of the upper electrode 17 may be decreased down to 6 nm or less while electric conductivity of the upper electrode 17 is retained.

As the alloy that is a main component of the upper electrode 17, for example, an alloy of magnesium and silver (Mg—Ag alloy) or an alloy of aluminum (Al) and lithium (Li) (Al—Li alloy) is preferable as in the upper electrode 17 of the first embodiment.

The metal element contained in the upper electrode 17 has a degeneration preventive function to inhibit the upper electrode 17 from being directly contacted with the organic layer 16 and losing electric conductivity as the intermediate layer 18 of the foregoing embodiment does. In the case where the upper electrode 17 is used as a cathode, the metal element preferably has electron injection characteristics. As described above, examples of such a material include the alkali metal, the alkali earth metal, and the lanthanoid metal. By providing the appropriate electron injection layer 16E, a metal having a larger work function than that of magnesium is able to be used. Examples of such a metal include a metal such as aluminum, indium, and tin; and a transition metal such as nickel, copper, and zinc.

Specifically, as the metal element contained in the upper electrode 17, calcium or aluminum is preferable as in the intermediate layer 18 of the first embodiment.

The thickness of the upper electrode 17 is more preferably from 2.5 nm to 6 nm both inclusive as in the upper electrode 17 of the first embodiment.

"Thickness of the upper electrode 17" in this specification is obtained by optical method such as spectroscopic ellipsometry. Further, "thickness of the upper electrode 17" is measured in a state of a product after being sealed with the sealing substrate 50 and being assembled.

The sheet resistance of the upper electrode 17 is preferably, for example, 10000Ω/□ or less as in the first embodiment.

The metal element contained in the upper electrode 17 is, for example, diffused in the upper electrode 17. Further, the metal element contained in the upper electrode 17 may be chemically changed by being contacted with the electron transport layer 16D and the electron injection layer 16E. The upper electrode 17 is formed as a laminated film composed of the intermediate layer 18 and the upper electrode 17 in a manufacturing step as in the first embodiment. However, after the upper electrode 17 is formed, the metal element as the material of the intermediate layer 18 is diffused and distributed in the upper electrode 17, and as a result, an integrated electrode layer composed of the intermediate layer 18 and the upper electrode 17 is structured. Therefore, if a cross section is analyzed, the intermediate layer 18 is not detected as a layer.

In this modified example, the translucent reflecting face P2 of the resonator structure MC1 is the interface between the upper electrode 17 and the electron injection layer 16E.

A method of manufacturing the display unit is similar to that of the foregoing first embodiment. That is, the intermediate layer 18 and the upper electrode 17 are formed as a laminated film as in the foregoing first embodiment. At this time, after the upper electrode 17 is formed, the metal element as the material of the intermediate layer 18 is diffused in the upper electrode 17, and as a result, the upper electrode 17 is formed as the integrated electrode layer composed of the intermediate layer 18 and the upper electrode 17. Accordingly, the organic EL devices 10R, 10G, and 10B illustrated in FIG. 5 are formed.

In the display unit, driving control is made for each pixel and display is made in the same manner as that described in the first embodiment. In this case, the upper electrode 17 contains the alloy of magnesium (Mg) or the like as a main component, and contains one selected from the metal element group consisting of the foregoing alkali metal and the like. Thus, lowering of electric conductivity caused by degeneration of the upper electrode 17 is inhibited, the organic EL devices 10R, 10G, and 10B are favorably driven, and favorable display performance is obtained for a long term. Further, since the thickness of the upper electrode 17 is small, generation of non-light emitting defect due to short circuit between the lower electrode 14 and the upper electrode 17 is inhibited.

As described above, in this modified example, the upper electrode 17 contains the alloy of magnesium (Mg) or the like as a main component, and contains one selected from the metal element group consisting of the foregoing alkali metal and the like. Thus, lowering of electric conductivity caused by degeneration of the upper electrode 17 is inhibited, and the thickness of the upper electrode 17 is able to be decreased down to from 2 nm to 6 nm both inclusive. Thus, in the case where a display unit is structured by using the organic EL devices 10R, 10G, and 10B, electric conductivity of the upper electrode 17 is retained, the organic EL devices 10R, 10G, and 10B are favorably driven, and non-light emitting defect is able to be decreased. In particular, the embodiments are suitable for the organic EL devices 10R, 10G, and 10B in which the resonator structure MC1 is included, and light generated in the light emitting layer 16C is resonated between the lower electrode 14 and the upper electrode 17.

Second Embodiment

Figure 6:
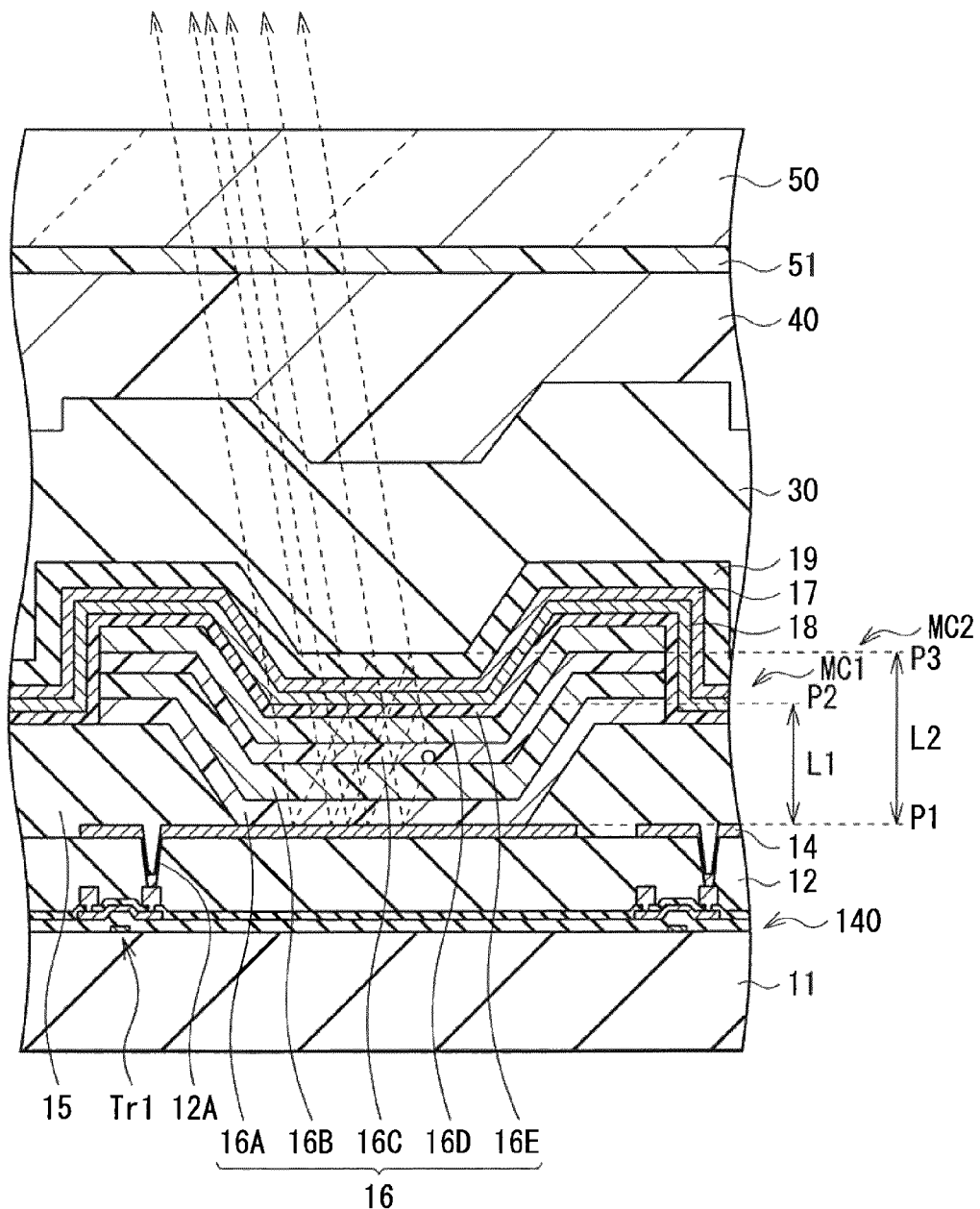
FIG. 6 is a cross sectional view illustrating a structure of an organic EL device according to a second embodiment.

FIG. 6 illustrates a cross sectional structure of the organic EL devices 10R, 10G, and 10B according to a second embodiment. The organic EL devices 10R, 10G, and 10B have a structure similar to that of the foregoing first embodiment, except that a resonance adjustment layer 19 is included between the upper electrode 17 and the protective layer 30. Thus, a description will be given by affixing the same referential symbols for the corresponding elements.

The resonance adjustment layer 19 is intended to control resonator effect of the resonator structure MC1 by providing a reflectance interface by using dielectric mirror principle on the upper electrode 17, and has a refractive index different from the refractive index of the protective layer 30. That is, the organic EL devices 10R, 10G, and 10B have a resonator structure MC2 (second resonator structure MC2). Light extracted from the resonator structure MC1 is resonated between the interference between the resonance adjustment layer 19 and the protective layer 30 and the lower electrode 14 by the resonator structure MC2. In the resonator structure MC2, the interface between the lower electrode 14 and the organic layer 16 is the reflecting face P1, the interface between the resonance adjustment layer 19 and the protective layer 30 is a translucent reflecting face P3, and the organic layer 16, the intermediate layer 18, the upper electrode 17, and the resonance adjustment layer 19 are a resonance section. The light extracted from the resonator structure MC1 is resonated and is extracted from the translucent reflecting face P3 side. In the case where the resonator structure MC2 is included as the second resonator structure, if resonator effect of the resonator structure MC1 is weakened by decreasing the thickness of the upper electrode 17, resonator effect is able to be controlled.

An optical distance L2 between the reflecting face P1 and the translucent reflecting face P3 preferably satisfies Mathematical formula 2.

$$(2L2)/\lambda + \Phi/(2\pi) = m \qquad \text{Mathematical formula 2}$$

In the formula, "L2" represents the optical distance between the reflecting face P1 and the translucent reflecting face P3. "m" represents an order (0 or a natural number). "Φ" represents a sum of the phase shift Φ1 of reflected light generated in the reflecting face P1 and a phase shift Φ3 of reflected light generated in the translucent reflecting face P3 (Φ=Φ1+Φ3) (rad). "λ" represents a peak wavelength of spectrum of light that is desirably extracted from the translucent reflecting face P3 side. For L2 and λ in the Mathematical formula 2, the unit should be unified, and for example, (nm) is used as the unit.

Further, the resonance adjustment layer 19 also has a function as a protective film to prevent deterioration of the upper electrode 17. That is, if the protective layer 30 is directly layered on the upper electrode 17 by CVD method or sputtering method after the upper electrode 17 is formed, there is a possibility that the upper electrode 17 is degenerated by introduced gas at the time of film forming, oxygen, high energy particles, oxygen in a chamber or mobile environment, moisture or the like, and function as an electrode is not able to be maintained. However, if the resonance adjustment layer 19 is provided by vacuum evaporation method continuously after the upper electrode 17 is formed, the upper electrode 17 is able to be protected.

The thickness of the resonance adjustment layer 19 is not particularly limited. However, to prevent degeneration of the upper electrode 17, for example, the thickness of the resonance adjustment layer 19 is desirably 10 nm or more. The film thickness setting is able to be adjusted as appropriate by optical design to adjust the intensity of the resonator structure MC2. However, the resonance adjustment layer 19 is supposed to be formed common to R, G, and B. Thus, it is desirable that the refractive index and the film thickness are set so that light extraction effect is favorable for all three color. As a material of the resonance adjustment layer 19, a material having small visible light absorption and having a small possibility to degenerate the upper electrode 17 at the time of film formation is desirable. It is able to select a material having a refractive index according to adjustment request of the resonator structure MC2. As a specific material, an vacuum evaporative inorganic film or a vacuum evaporative organic film represented by lithium fluoride (refractive index of 1.38 in 460 nm), potassium bromide (refractive index of 1.58), Alq3 (refractive index of 1.84), $MoO_3$ (refractive index of 2.22), ZnSe (refractive index of 2.6) and the like are able to be used.

The refractive index of the resonance adjustment layer 19 is preferably smaller than the refractive index of the protective layer 30 for the following reason. That is, the translucent reflecting face P3 of the resonator structure MC2 is formed by refractive index difference of the interface between the resonator adjustment layer 19 and the protective layer 30. Thus, if the refractive index difference is increased, resonator effect is intensified, while if the refractive index difference is decreased, resonator effect is weakened. To intensify the resonator effect by increasing the refractive index difference, the refractive index of the resonance adjustment layer 19 is set smaller than that of the protective layer 30, or is set larger than that of the protective layer 30. If the refractive index of the resonance adjustment layer 19 is set smaller than that of the protective layer 30, as a result of phase shift in the reflecting face P1, the order m of the resonator structure MC2 is able to be identical with the order m of the resonator structure MC1 composed of the lower electrode 14 and the upper electrode 17. Further, in the case where the light emitting position of each light emitting layer 16C of the organic light emitting devices 10R, 10G, and 10B is located in the resonance position that is most proximal to the lower electrode 14, even if the resonance adjustment layer 19 is formed common to the organic light emitting devices 10R, 10G, and 10B, resonance intensity is able to be intensified for all the organic light emitting devices 10R, 10G, and 10B.

In the case where there is no need to intensify resonator effect, the refractive index of the resonance adjustment layer 19 is able to be set to a value close to the refractive index of the protective layer 30. For example, in the case where the protective layer 30 is composed of silicon nitride (refractive index from 1.8 to 1.9 both inclusive), the refractive index of the organic material represented by Alq3 is about 1.9, and is suitable for the resonance adjustment layer 19. In addition, other organic film or other inorganic film may be used.

The display unit is able to be manufactured in the same manner as that of the first embodiment, except that the resonance adjustment layer 19 made of the foregoing material is formed by vacuum evaporation method continuously after the upper electrode 17 is formed.

In the display unit, driving control is made for each pixel and display is made in the same manner as that described in the first embodiment. In this case, the resonance adjustment layer 19 is provided between the upper electrode 17 and the protective layer 30, and the resonator structure MC2 is structured. Thus, in the case where resonator effect of the resonator structure MC1 is weakened by decreasing the thickness of the upper electrode 17, intensity of light extracted from the front face is increased.

As described above, in the organic EL devices 10R, 10G, and 10B of this embodiment, the resonance adjustment layer 19 is provided between the upper electrode 17 and the protective layer 30, and the resonator structure MC2 is structured. Thus, in the case where resonator effect of the resonator structure MC1 is weakened by decreasing the thickness of the upper electrode 17, the resonator effect is able to be controlled.

Figure 7:
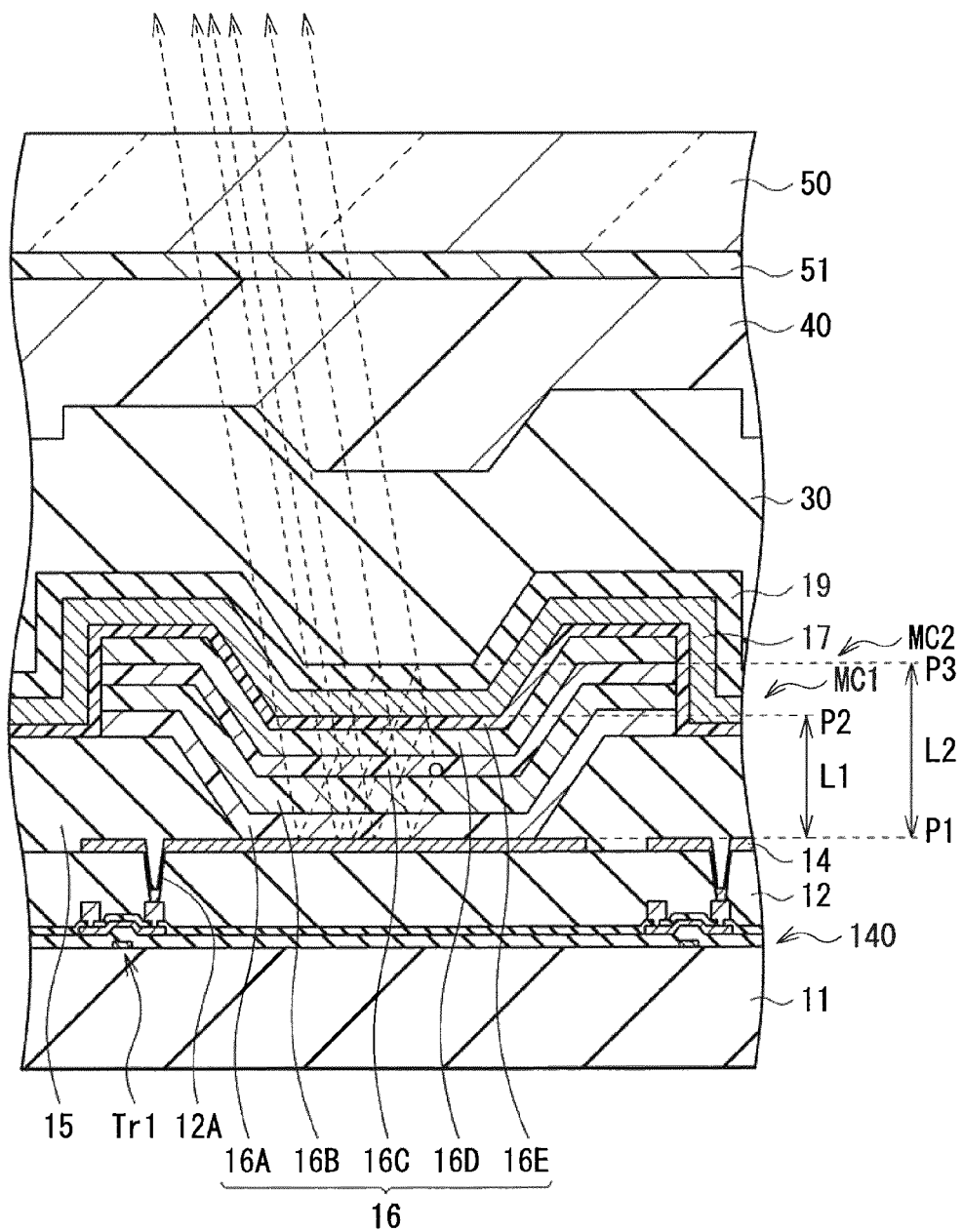
FIG. 7 is a cross sectional view illustrating another structure of the organic EL device illustrated in FIG. 6.

In this embodiment, as illustrated in FIG. 7, it is possible that the metal element as a material of the intermediate layer 18 is diffused and distributed in the upper electrode 17, and as a result, the upper electrode 17 is structured as an integrated electrode layer composed of the intermediate layer 18 and the upper electrode 17.

Module and Application Examples

A description will be given of application examples of the display unit described in the foregoing embodiments. The display unit of the foregoing embodiments is able to be applied to a display unit of an electronic device in any field for displaying a video signal inputted from outside or a video signal generated inside as an image or a video, such as a television device, a digital camera, a notebook personal computer, a portable terminal device such as a mobile phone, and a video camera.

Module

Figure 8:
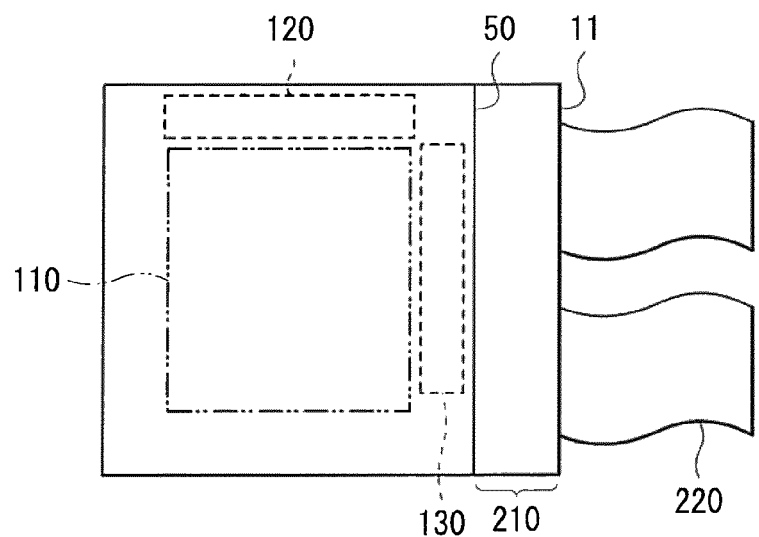
FIG. 8 is a plan view illustrating a schematic structure of a module including the display unit of the foregoing embodiments.

The display unit of the foregoing embodiments is incorporated in various electronic devices such as after-mentioned first to fifth application examples as a module as illustrated in FIG. 8, for example. In the module, for example, a region 210 exposed from the sealing substrate 50 and the adhesive layer 40 is provided on a side of the substrate 11, and an external connection terminal (not illustrated) is formed in the exposed region 210 by extending the wirings of the signal line drive circuit 120 and the scanning line drive circuit 130. The external connection terminal may be provided with a Flexible Printed Circuit (FPC) 220 for inputting and outputting a signal.

First Application Example

Figure 9:
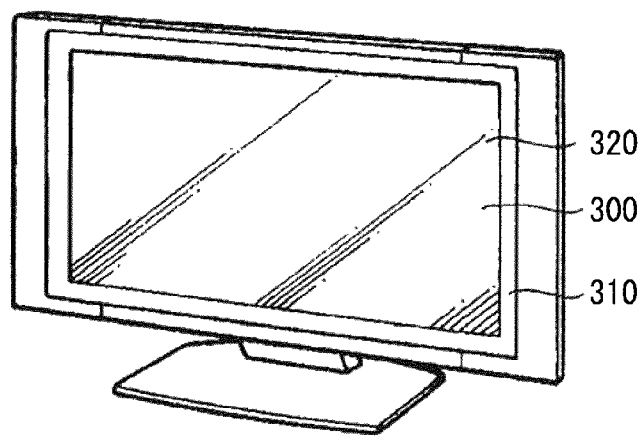
FIG. 9 is a perspective view illustrating an appearance of a first application example of the display unit of the foregoing embodiments.

FIG. 9 is an appearance of a television device to which the display unit of the foregoing embodiments is applied. The television device has, for example, a video display screen section 300 including a front panel 310 and a filter glass 320. The video display screen section 300 is composed of the display unit according to the foregoing respective embodiments.

Second Application Example

Figure 10A:
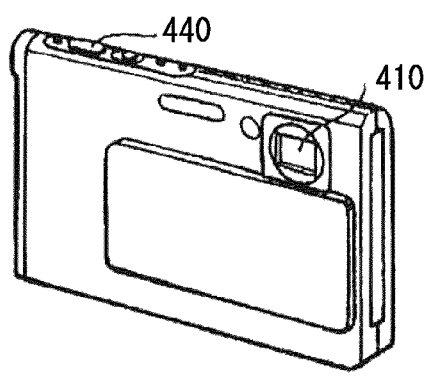
FIG. 10A is a perspective view illustrating an appearance viewed from the front side of a second application example.
Figure 10B:
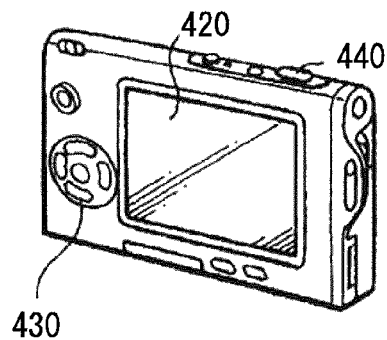
FIG. 10B is a perspective view illustrating an appearance viewed from the rear side of the second application example.

FIGS. 10A and 10B are an appearance of a digital camera to which the display unit of the foregoing embodiments is applied. The digital camera has, for example, a light emitting section for a flash 410, a display section 420, a menu switch 430, and a shutter button 440. The display section 420 is composed of the display unit according to the foregoing respective embodiments.

Third Application Example

Figure 11:
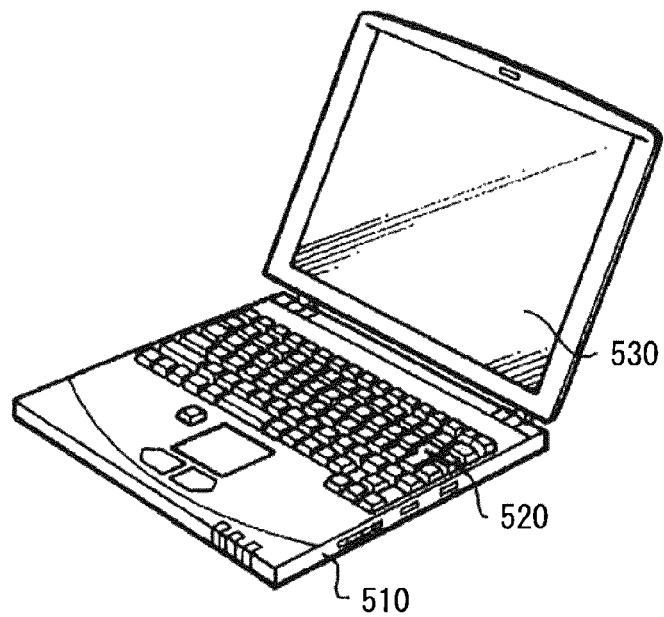
FIG. 11 is a perspective view illustrating an appearance of a third application example.

FIG. 11 is an appearance of a notebook personal computer to which the display unit of the foregoing embodiments is applied. The notebook personal computer has, for example, a main body 510, a keyboard 520 for operation of inputting characters and the like, and a display section 530 for displaying an image. The display section 530 is composed of the display unit according to the foregoing respective embodiments.

Fourth Application Example

Figure 12:
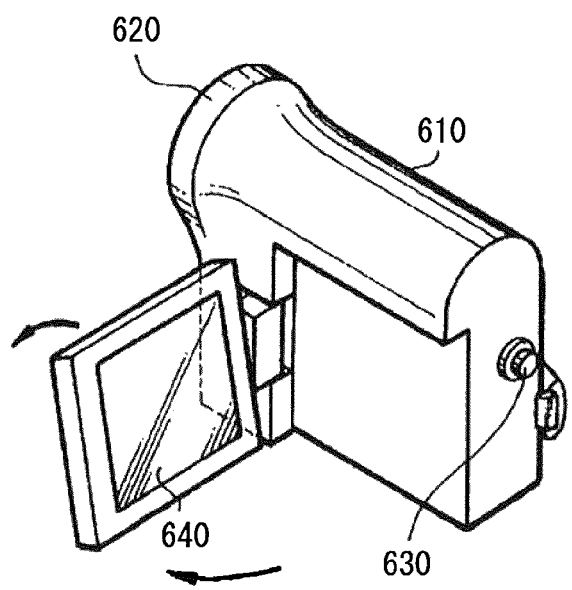
FIG. 12 is a perspective view illustrating an appearance of a fourth application example.

FIG. 12 is an appearance of a video camera to which the display unit of the foregoing embodiments is applied. The video camera has, for example, a main body 610, a lens for shooting an object 620 provided on the front side face of the main body 610, a start/stop switch in shooting 630, and a display section 640. The display section 640 is composed of the display unit according to the foregoing respective embodiments.

Fifth Application Example

FIGS. 13A to 13G are an appearance of a mobile phone to which the display unit of the foregoing embodiments is applied. In the mobile phone, for example, an upper package 710 and a lower package 720 are jointed by a joint section (hinge section) 730. The mobile phone has a display 740, a sub-display 750, a picture light 760, and a camera 770. The display 740 or the sub-display 750 is composed of the display unit according to the foregoing respective embodiments.

EXAMPLES

A description will be given of specific examples.

Examples 1-1 to 1-4

The intermediate layer 18 and the upper electrode 17 of the foregoing first embodiment were formed. At this time, the intermediate layer 18 was composed of calcium (Ca), and the thickness thereof was 2.0 nm. The upper electrode 17 was composed of an Mg—Ag alloy, and the thickness thereof was varied as illustrated in Table 1. To match with the conditions of the organic light emitting devices 10R, 10G, and 10B, as a foundation of the intermediate layer 18, a vacuum evaporated film having a thickness of 20 nm obtained by resistance heating of an electron transport material was formed. The upper electrode 17 was deposited at a vapor rate of 0.1 nm/sec by vacuum evaporation method by resistance heating at a high vacuum degree of $1*10^{-5}$ Pa or less. The co-evaporation ratio of magnesium and silver was Mg:Ag=10:1. To prevent degeneration by air, a lithium fluoride film having a thickness of 40 m was formed by vacuum evaporation on the upper electrode 17. After that, the resultant was sealed with an ultraviolet hardened resin.

Comparative Examples 1-1 and 1-2

An upper electrode composed of a Mg—Ag alloy was formed in the same manner as that of the foregoing Examples 1-1 to 1-4, except that the intermediate layer was not provided. At this time, the thickness of the upper electrode was varied as illustrated in Table 1.

For the obtained intermediate layer or the obtained upper electrode of Examples 1-1 to 1-4 and Comparative examples 1-1 and 1-2, the thickness was measured by spectroscopic ellipsometry, and the sheet resistance was examined. The results thereof are all illustrated in Table 1.

TABLE 1

| | Material of intermediate layer (thickness)/material of upper electrode (thickness) | Sheet resistance (Ω/□) |
| --- | --- | --- |
| Example 1-1 | Ca (2.0 nm)/Mg—Ag (2.0 nm) | 585 |
| Example 1-2 | Ca (2.0 nm)/Mg—Ag (3.0 nm) | 306 |
| Example 1-3 | Ca (2.0 nm)/Mg—Ag (4.0 nm) | 215 |
| Example 1-4 | Ca (2.0 nm)/Mg—Ag (5.0 nm) | 162 |
| Comparative example 1-1 | Mg—Ag (10.0 nm) | 86 |

TABLE 1-continued

| | Material of intermediate layer (thickness)/material of upper electrode (thickness) | Sheet resistance (Ω/□) |
|---|---|---|
| Comparative example 1-2 | Mg—Ag (4.0 nm) | 28500 |

As evidenced by Table 1, in Comparative example 1-2 in which the intermediate layer was not provided and the thickness of the upper electrode was decreased, the sheet resistance was significantly deteriorated compared to in Comparative example 1-1 in which only the thick upper electrode was provided. Meanwhile, in Examples 1-1 to 1-4 in which the thickness of the upper electrode 17 was decreased and the intermediate layer 18 was provided, the sheet resistance was significantly improved compared to in Comparative example 1-2 in which the intermediate layer was not provided and the thickness of the upper electrode was decreased, and a result close to that of Comparative example 1-1 in which only the thick upper electrode was provided was obtained.

That is, it was found that in the case where the intermediate layer 18 composed of calcium (Ca) was provided being contacted with the upper electrode 17 between the upper electrode 17 and the organic layer 16, the thickness was able to be decreased down to 6 nm or less while electric conductivity of the upper electrode 17 was retained.

Examples 2-1 to 2-4

The organic EL device of the first embodiment was fabricated by using the intermediate layer 18 and the upper electrode 17 illustrated in Table 1. First, as the lower electrode 14, an aluminum-neodymium alloy film (film thickness: 150 nm) was formed on the substrate 11 made of a glass plate sized 25 mm*25 mm. Further, as a contact with the upper electrode 17 and a connection section to a power line, a pad section (not illustrated) composed of titanium was provided on the substrate 11.

Next, the lower electrode 14 was coated with a photosensitive organic insulating material, and an aperture was provided correspondingly to a light emitting region sized 2 mm*2 mm in the central section of the lower electrode 14. Thereby, the interelectrode insulating film 15 was formed.

Subsequently, a metal mask having an aperture was prepared. The metal mask was arranged in the proximity of the substrate 11 in a state that the aperture of the metal mask was aligned with the light emitting region of the lower electrode 14. After that, the electron hole injection layer 16A to the electron injection layer 16E were sequentially formed by vacuum evaporation method under vacuum atmosphere of $1*10^{-5}$ Pa or less. At this time, the optical distance L1 between the reflecting face P1 and the translucent reflecting face P2 was adjusted to satisfy Mathematical formula 1 by adjusting the thickness of the electron injection layer 16A to the electron injection layer 16E to structure the resonator structure MC1.

For the electron hole injection layer 16A, a film having a thickness of 20 nm composed of the hexaazatriphenylene derivative shown in Chemical formula 2 was formed. For the electron hole transport layer 16B, a film having a thickness of 25 nm composed of α-NPD was formed. The evaporation rate was 0.1 nm/sec. For the light emitting layer 16C, a co-evaporated film having a thickness of 30 nm in which $Alq_3$ host was doped with 1% coumarin 6 as a green light emitting material was formed. The evaporation rate was 0.2 nm/sec. For the electron transport layer 16D, a film having a thickness of 175 nm composed of $Alq_3$ was formed. The evaporation rate was 0.2 nm/sec.

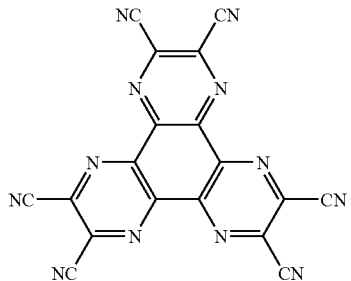

Chemical formula 2

After the electron transport layer 16D was formed, a metal mask having an aperture corresponding to a pad section was prepared. The metal mask was arranged in the proximity of the substrate 11. As the electron injection layer 16E, a film having a thickness of 0.3 nm composed of lithium fluoride was formed. Subsequently, the intermediate layer 18 and the upper electrode 17 were formed in the same manner as that of Examples 1-1 to 1-4. The film forming conditions were identical with those of Examples 1-1 to 1-4.

TABLE 2

(characteristics: value in current density of 10 mA/cm²)

| | Intermediate layer (nm) Ca | Upper electrode (nm) Mg—Ag alloy | Front face efficiency (cd/A) | Drive voltage (V) | Luminance ratio (45 deg/front face) |
|---|---|---|---|---|---|
| Example 2-1 | 2.0 | 2.5 | 12.4 | 7.60 | 0.85 |
| Example 2-2 | 2.0 | 3.0 | 12.5 | 7.49 | 0.84 |
| Example 2-3 | 2.0 | 4.0 | 13.0 | 7.32 | 0.80 |
| Example 2-4 | 2.0 | 5.0 | 13.4 | 7.38 | 0.75 |
| Comparative example 2-1 | Not applicable | 5.0 | Not conducted | — | — |
| Comparative example 2-2 | Not applicable | 6.0 | 13.6 | 9.54 | 0.70 |
| Comparative example 2-3 | Not applicable | 7.0 | 13.8 | 7.74 | 0.65 |
| Comparative example 2-4 | Not applicable | 9.0 | 13.9 | 7.58 | 0.57 |

After that, as the resonance adjustment layer 19, a film having a thickness of 40 nm composed of $Alq_3$ was formed on the upper electrode 17 by vacuum evaporation method continuously after the upper electrode 17 was formed. Subsequently, as the protective layer 30, a silicon nitride film having a thickness of 1 μm was formed by plasma CVD method. In the examples, the resonance adjustment layer 19 was used as a protective film to inhibit degeneration of the upper electrode 17, and the resonator structure MC2 was not structured. After that, the sealing substrate 50 made of glass was bonded by using the adhesive layer 40 made of an ultraviolet hardened resin.

Comparative Examples 2-1 to 2-4

An organic EL device was formed in the same manner as that of the foregoing Examples 2-1 to 2-4, except that the intermediate layer was not formed. At this time, the thickness of the upper electrode was varied as illustrated in Table 2.

For the obtained organic EL devices of Examples 2-1 to 2-4 and Comparative examples 2-1 to 2-4, the initial characteristics were measured. The result is also illustrated in Table 2. In Table 2, the luminance ratio is a ratio of the luminance measured from 45 deg oblique direction with respect to the front face luminance.

As evidenced by Table 2, in Examples 2-1 to 2-4 in which the thickness of the upper electrode 17 was 2.5 nm or more, for all the front face efficiency, the drive voltage, and the luminance ratio, favorable results were obtained. In particular, the luminance ratio was 0.7 or more in Examples 2-1 to 2-4, and the view angle characteristics were improved. The reason thereof may be as follows. That is, since the thickness of the upper electrode 17 was decreased, the resonator effect of the resonator structure MC1 was moderated. Further, continuous lighting was made for examples 2-1 to 2-4. In the result, lighting was enabled without any trouble for all examples.

The thickness of the upper electrode 17 in Examples 2-1 to 2-4 was optically obtained by reflectance measurement. As a result, it is not necessary to optically consider the intermediate layer 18 composed of calcium (Ca) as a metal film. In some cases, the intermediate layer 18 composed of calcium (Ca) is chemically changed by being contacted with the electron transport layer 16D composed of Alq3 or the electron injection layer 16E composed of LiF. In some cases, the intermediate layer 18 composed of calcium (Ca) is diffused and distributed in the upper electrode 17.

Meanwhile, in Comparative example 2-1 in which the thickness of the upper electrode was 5.0 nm, the resistance of the upper electrode was high and conduction was not enabled. Similarly, in the case where the thickness of the upper electrode was 5.0 or less, conduction was not enabled. In Comparative examples 2-2 and 2-3 in which the thickness of the upper electrode was 6.0 nm or 7.0 nm, the initial conduction was enabled. However, in this case, continuous lighting resulted in intense rise of a drive voltage, and deterioration was significant. Accordingly, it was found as follows. That is, it was only Comparative example 2-4 having the thickness of the upper electrode of 9.0 nm that both the initial driving and the continuous driving were stably enabled. In addition, in the case where the intermediate layer was not provided, the thickness of the metal film should be at least 9.0 nm. In Comparative examples 2-1 to 2-4, the luminance ratio was all 0.70 or less, and light emitting characteristics change according to the view angle was large.

Further, in the case where comparison was made among Examples 2-2 to 2-4, there was a tendency that as the thickness of the upper electrode 17 was decreased, the front face efficiency was lowered, while the luminance ratio was increased. The reason thereof may be as follows. That is, since the thickness of the upper electrode 17 was decreased, resonator effect of the resonator structure MC1 was weakened.

That is, it was found that in the case where the intermediate layer 18 composed of calcium (Ca) was provided being contacted with the upper electrode 17 between the upper electrode 17 and the organic layer 16, even if the thickness of the upper electrode 17 was decreased down to 6 nm or less, electric conductivity was retained, and the organic EL device was favorably driven for a long term.

Comparative Example 2-5

An organic EL device was formed in the same manner as that of Examples 2-1 to 2-4, except that the upper electrode was composed of silver (Ag) instead of the Mg—Ag alloy, and the thickness thereof was 7 nm. At this time, the intermediate layer was formed in the same manner as that of Examples 2-1 to 2-4. For the obtained organic EL device, the reflective spectrum of the upper electrode was examined. The result was largely different from the assumed result of the simple silver (Ag). Further, when the organic EL device was tried to be lighted, conduction was not enabled. The reason thereof may be as follows. That is, in the silver (Ag) thin film, the film quality was not stable.

Comparative Example 2-6

An organic EL device was formed in the same manner as that of Examples 2-1 to 2-4, except that the upper electrode was composed of aluminum (Al) instead of the Mg—Ag alloy, and the thickness thereof was 7 nm. At this time, the intermediate layer was formed in the same manner as that of Examples 2-1 to 2-4. When the obtained organic EL device was tried to be lighted, conduction was not enabled.

That is, it was found that in the case where the upper electrode 17 was composed of the Mg—Ag alloy, the organic EL device was able to be favorably driven.

Examples 3-1 to 3-4

An organic EL device was formed in the same manner as that of Examples 2-1 to 2-4, except that the thickness of the upper electrode 17 was 5.0 nm, and the thickness of the intermediate layer 18 was varied as illustrated in Table 3. Example 3-3 was identical with Example 2-4. For the obtained organic EL device, the initial characteristics were examined. The results thereof are also illustrated in Table 3.

TABLE 3

| | Intermediate layer (nm) Ca | Upper electrode (nm) Mg—Ag alloy | Front face efficiency (cd/A) | Drive voltage (V) | Luminance ratio (45 deg/front face) |
|---|---|---|---|---|---|
| Example 3-1 | 0.5 | 5.0 | 13.9 | 7.75 | 0.83 |
| Example 3-2 | 1.0 | 5.0 | 13.8 | 7.36 | 0.78 |
| Example 3-3 | 2.0 | 5.0 | 13.4 | 7.38 | 0.75 |
| Example 3-4 | 4.0 | 5.0 | 12.9 | 7.93 | 0.72 |

As evidenced by Table 3, for all the front face efficiency, the drive voltage, and the luminance ratio, favorable results were obtained not depending on the thickness of the intermediate layer 18. In particular, the luminance ratio was 0.7 or more in Examples 3-1 to 3-4, which was favorable. Further, luminance deterioration characteristics in driving at a certain current was examined. The result was almost equal to that of Comparative example 1-1 in which the thickness of the metal film composed of the Mg—Ag alloy was 10 nm.

That is, it was found that in the case where the thickness of the intermediate layer 18 was from 0.5 nm to 4 nm both inclusive, the organic EL device was able to be favorably driven.

Example 4

As the resonance adjustment layer 19, a film composed of lithium fluoride having a thickness of 20 nm was formed. The thickness of the organic layer was adjusted so that the optical distance L2 between the reflecting face P1 and the translucent reflecting face P3 satisfied Mathematical formula 2. Accordingly, the resonator structure MC2 was structured. At this time, the phase shift $\Phi_3$ in the translucent reflecting face P3 in the resonator structure MC2 was different from the phase shift $\Phi_2$ in the translucent reflecting face P2 in the resonator structure MC1, and thus the optical distance L1 is different from the optical distance L2, but the order m was identical. The organic EL device was formed in the same manner as that of Example 2-4 as for the rest.

For the obtained organic EL device, the extraction intensity in the front face was examined. In the result, the extraction intensity was improved than that of Example 2-4 by 6%.

That is, it was found that in the case where the resonator structure MC2 was structured by providing the resonance adjustment layer 19 between the upper electrode 17 and the protective layer 30, if resonator effect of the resonator structure MC1 is weakened by decreasing the thickness of the upper electrode 17, the resonator effect is able to be controlled.

Example 5

An active matrix organic EL display unit having a pixel count of 960*540 was fabricated in the same manner as that of Example 2-4, except that the intermediate layer 18 was composed of calcium (Ca) (thickness: 2 nm) and the upper electrode 17 was composed of an Mg—Ag alloy (thickness: 5 nm).

Comparative Example 5

An active matrix organic EL display unit having a pixel count of 960*540 was fabricated. The intermediate layer was not provided, and the upper electrode was composed of an Mg—Ag alloy (thickness: 8 nm).

For the obtained organic EL display units of Example 5 and Comparative example 5, the average number of non-light emitting defects per panel was examined. In Example 5, the result was one twenty-fifth (1/25) of Comparative example 5, which means the average number of non-light emitting defects was able to be significantly decreased. The reason thereof may be as follows. That is, in Example 5, the thickness of the upper electrode 17 was small. Thus, in a manufacturing step, the upper electrode 17 intrudes into around a foreign matter on the lower electrode 14, and thereby a leak pass formation between the lower electrode 14 and the upper electrode 17 was inhibited.

That is, it was found that in the case where a display unit was structured by using the organic EL device in which the intermediate layer 18 was provided being contacted with the upper electrode 17 between the upper electrode 17 and the organic layer 16, the thickness of the upper electrode 17 was able to be decreased, and the number of non-light emitting defects was able to be decreased.

Example 6

An organic EL device was formed in the same manner as that of Examples 2-1 to 2-4, except that the intermediate layer 18 was composed of aluminum (Al) (thickness: 1 nm) and the upper electrode 17 was composed of an Mg—Ag alloy (thickness: 5 nm). For the obtained organic EL device, the initial characteristics were examined. The obtained result is illustrated in Table 4.

TABLE 4

| | Intermediate layer (nm) Al | Upper electrode (nm) Mg—Ag alloy | Front face efficiency (cd/A) | Drive voltage (V) | Luminance ratio (45 deg/front face) |
|---|---|---|---|---|---|
| Example 6 | 1.0 | 5.0 | 12.9 | 7.35 | 0.76 |

As evidenced by Table 4, in the case where aluminum (Al) was used instead of calcium (Ca) as the intermediate layer 18, favorable light emission was obtained as well. Further, luminance deterioration characteristics in driving at a certain current were examined. The result was equal to that of Comparative example 2-4.

That is, it was found that in the case where the intermediate layer 18 composed of aluminum (Al) was provided being contacted with the upper electrode 17 between the upper electrode 17 and the organic layer 16, even if the thickness of the upper electrode 17 was decreased down to 6 nm or less, electric conductivity was retained, and the organic EL device was favorably driven for a long term.

In the foregoing second embodiment and the foregoing examples, the description has been given of the case that the resonance adjustment layer 19 was provided between the upper electrode 17 and the protective layer 30, and the interface between the resonance adjustment layer 19 and the protective layer 30 was the translucent reflecting face P3. However, the resonance adjustment layer 19 may be provided in other position. For example, if the protective layer 30 is not provided, the resonance adjustment layer 19 is able to be provided between the upper electrode 17 and the adhesive layer 40. Further, the resonance adjustment layer 19 may be provided between the protective layer 30 and the adhesive layer 40.

Further, for example, the material, the thickness, the film-forming method, the film-forming conditions and the like of each layer are not limited to those described in the foregoing embodiments and the foregoing examples, but other material, other thickness, other film-forming method, and other film-forming conditions may be adopted.

Further, for example, in the foregoing embodiments and the foregoing examples, the description has been given of the case that the lower electrode 14, the organic layer 16, and the upper electrode 17 are sequentially layered from the substrate 11 side over the substrate 11, and light is extracted from the sealing substrate 50 side. However, it is possible that the lamination order is reversed, that is, the upper electrode 17, the organic layer 16, and the lower electrode 14 are sequentially layered from the substrate 11 side over the substrate 11, and light is extracted from the substrate 11 side.

In addition, for example, in the foregoing embodiments and the foregoing examples, the description has been given of the case that the lower electrode 14 is an anode, and the upper electrode 17 is a cathode. However, it is possible that the lower electrode 14 is a cathode, and the upper electrode 17 is an anode. Further, it is possible that the lower electrode 14 is a cathode, the upper electrode 17 is an anode, and the upper electrode 17, the organic layer 16, and the lower electrode 14 are sequentially layered from the substrate 11 side over the substrate 11, and light is extracted from the substrate 11 side.

Furthermore, in the foregoing embodiments and the foregoing examples, the description has been specifically given of the structure of the organic light emitting devices 10R, 10G, and 10B. However, it is not always necessary to provide all layers, and other layer may be further provided.

In addition, in the foregoing embodiments and the foregoing examples, the description has been given of the active matrix display unit. However, the embodiments are also able to be applied to a passive matrix display unit. Furthermore, the structure of the pixel drive circuit for driving the active matrix is not limited to the structure described in the foregoing embodiments and the foregoing examples. If necessary, a capacity device or a transistor may be added. In this case, according to the change of the pixel drive circuit, a necessary drive circuit may be added in addition to the foregoing signal line drive circuit 120 and the foregoing scanning line drive circuit 130.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. An organic electroluminescence device comprising:
   a first electrode;
   an organic layer formed on the first electrode and including a light-emitting layer;
   an intermediate layer formed on the organic layer; and
   a second electrode formed on the intermediate layer and having a thickness of 6 nm or less; and
   wherein the organic layer includes an electron hole injection layer, an electron hole transport layer, the light-emitting layer, an electron transport layer, and an electron injection layer that are layered in that order from a first electrode side;
   wherein the organic layer between the first electrode and the second electrode constitutes a first resonator structure, the interface between the first electrode and the organic layer is a first reflecting face, the interface between the intermediate layer and the electron injection layer is a second reflecting face, and
   wherein light generated in the light emitting layer is resonated in the first resonator structure and is extracted from a second reflecting face side;
   wherein an optical distance between the first reflecting face and the second reflecting face satisfies Mathematical formula 1:

$(2L1)/\lambda + \Phi)/(2\pi) = m$ wherein L1 represents the optical distance between the first reflecting face and the second reflecting face,
   wherein m represents zero or a natural number,
   wherein $\Phi$ represents a sum of
   a phase shift $\Phi 1$ of reflected light generated in the first reflecting face, and
   a phase shift $\Phi 2$ of reflected light generated in the second reflecting face, and
   wherein $\lambda$ represents a peak wavelength of a spectrum of light that is extracted from the second reflecting face side;
   further comprising a resonance adjustment layer formed on the second electrode, and a protective layer formed on the resonance adjustment layer;
   wherein the organic layer, the intermediate layer, the second electrode, and the resonance adjustment layer constitute a second resonator structure,
   wherein an interface between the resonance adjustment layer and the protective layer is a third reflecting face,
   wherein light extracted from the first resonator structure is resonated between the first reflecting face and the third reflecting face by the second resonator structure, and
   wherein the light extracted from the first resonator structure is resonated and extracted from a third reflecting face side.

2. The organic electroluminescence device according to claim 1, wherein at least a portion of a metal element contained in the intermediate layer is diffused into the second electrode.

3. The organic electroluminescence device according to claim 1, wherein the second electrode is made of a metal conductive film including an alloy comprising one or more of aluminum, magnesium, calcium and sodium.

4. The organic electroluminescence device according to claim 3, wherein the alloy of the second electrode is a Mg—Ag alloy or an Al—Li alloy.

5. The organic electroluminescence device according to claim 1, wherein the thickness of the second electrode ranges from 2 nm to 6 nm.

6. The organic electroluminescence device according to claim 1, wherein a thickness of the intermediate layer ranges from 0.1 nm to 5 nm.

7. The organic electroluminescence device according to claim 6, wherein the intermediate layer includes at least one element selected from the group consisting of: an alkali metal, an alkali earth metal, a lanthanide metal, aluminum, indium, tin, nickel, copper and zinc.

8. The organic electroluminescence device according to claim 1, wherein the intermediate layer is made of an electron injection material including at least one metal selected from the group consisting of: aluminum, indium, tin, nickel, copper and zinc.

9. The organic electroluminescence device according to claim 1, wherein the intermediate layer includes calcium or aluminum.

10. The organic electroluminescence device according to claim 1, wherein a sheet resistance of a film comprising the intermediate layer and the second electrode is 10,000Ω/□ or less.

11. The organic electroluminescence device according to claim 1, wherein the intermediate layer is at least substantially diffused into the second electrode.

12. The organic electroluminescence device according to claim 1, wherein a second optical distance between the first reflecting face and the third reflecting face satisfies Mathematical formula 2:

$(2L2)/\lambda + \Phi_2)/(2\pi) = m$ wherein L2 represents an optical distance between the first reflecting face and the third reflecting face,
wherein m represents zero or a natural number,
wherein $\Phi_2$ represents a sum of the phase shift $\Phi 1$ of reflected light generated in the first reflecting face and a phase shift $\Phi 3$ of reflected light generated in the third reflecting face, and
wherein $\lambda$ represents a peak wavelength of a spectrum of light that is extracted from the third reflecting face side.

13. A display device comprising at least one organic electroluminescent device according to claim 1.

14. The display device according to claim 13, wherein the second electrode includes a Mg—Ag alloy or an Al—Li alloy.

15. The display device according to claim 13, wherein the thickness of the second electrode ranges from 2 nm to 6 nm.

16. The display device according to claim 13, wherein a thickness of the intermediate layer ranges from 0.1 nm to 5 nm.

17. The display device according to claim 13, wherein the intermediate layer includes calcium or aluminum.

18. The display device according to claim 13, wherein a sheet resistance of a film comprising the intermediate layer and the second electrode is 10,000Ω/□ or less.

* * * * *